(12) United States Patent
Su et al.

(10) Patent No.: US 11,024,504 B2
(45) Date of Patent: Jun. 1, 2021

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Chia-Wei Su, Taoyuan (TW); Fu-Ting Yen, Hsinchu (TW); Ting-Ting Chen, New Taipei (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/940,270

(22) Filed: Jul. 27, 2020

(65) Prior Publication Data
US 2020/0357646 A1 Nov. 12, 2020

Related U.S. Application Data

(62) Division of application No. 16/122,235, filed on Sep. 5, 2018, now Pat. No. 10,727,065.

(60) Provisional application No. 62/591,737, filed on Nov. 28, 2017.

(51) Int. Cl.
| | |
|---|---|
| *H01L 21/28* | (2006.01) |
| *H01L 21/3213* | (2006.01) |
| *H01L 21/02* | (2006.01) |
| *H01L 29/66* | (2006.01) |
| *H01L 21/311* | (2006.01) |
| *H01L 21/285* | (2006.01) |
| *H01L 21/3105* | (2006.01) |
| *H01L 21/321* | (2006.01) |
| *H01L 21/3205* | (2006.01) |
| *H01L 21/32* | (2006.01) |

(52) U.S. Cl.
CPC .... *H01L 21/28088* (2013.01); *H01L 21/0206* (2013.01); *H01L 21/0228* (2013.01); *H01L 21/02118* (2013.01); *H01L 21/02282* (2013.01); *H01L 21/28079* (2013.01); *H01L 21/28556* (2013.01); *H01L 21/3105* (2013.01); *H01L 21/31058* (2013.01); *H01L 21/31116* (2013.01); *H01L 21/321* (2013.01); *H01L 21/32051* (2013.01); *H01L 21/32135* (2013.01); *H01L 29/6656* (2013.01); *H01L 21/32* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 9,589,807 B1 * | 3/2017 | Huang | ............ H01L 21/32137 |
| 2005/0260843 A1 * | 11/2005 | Singh | ................ H01L 21/76831 438/597 |
| 2010/0266966 A1 * | 10/2010 | Park | ...................... G03F 7/0046 430/323 |
| 2013/0251904 A1 | 9/2013 | Kato et al. | |

(Continued)

*Primary Examiner* — Hsien Ming Lee
(74) *Attorney, Agent, or Firm* — Maschoff Brennan

(57) ABSTRACT

A semiconductor device includes a substrate, a gate structure over the substrate, gate spacers on opposite sidewalls of the gate structure, an inhibitor residue over gate structure and between the gate spacers, and source/drain structures on opposite sides of the gate structure. The inhibitor residue lines a sidewall of one of the gate spacers.

20 Claims, 19 Drawing Sheets

(56) References Cited

U.S. PATENT DOCUMENTS

2014/0051239 A1    2/2014   Breyta et al.
2018/0096892 A1    4/2018   Sandoh

* cited by examiner

SEMICONDUCTOR STRUCTURE AND MANUFACTURING METHOD THEREOF

PRIORITY CLAIM AND CROSS-REFERENCE

The present application is a Divisional application of U.S. application Ser. No. 16/122,235, filed on Sep. 15, 2018, now U.S. Pat. No. 10,727,065, issued on Jul. 28, 2020, which claims priority to U.S. Provisional Application Ser. No. 62/591,737, filed Nov. 28, 2017, which are herein incorporated by references.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
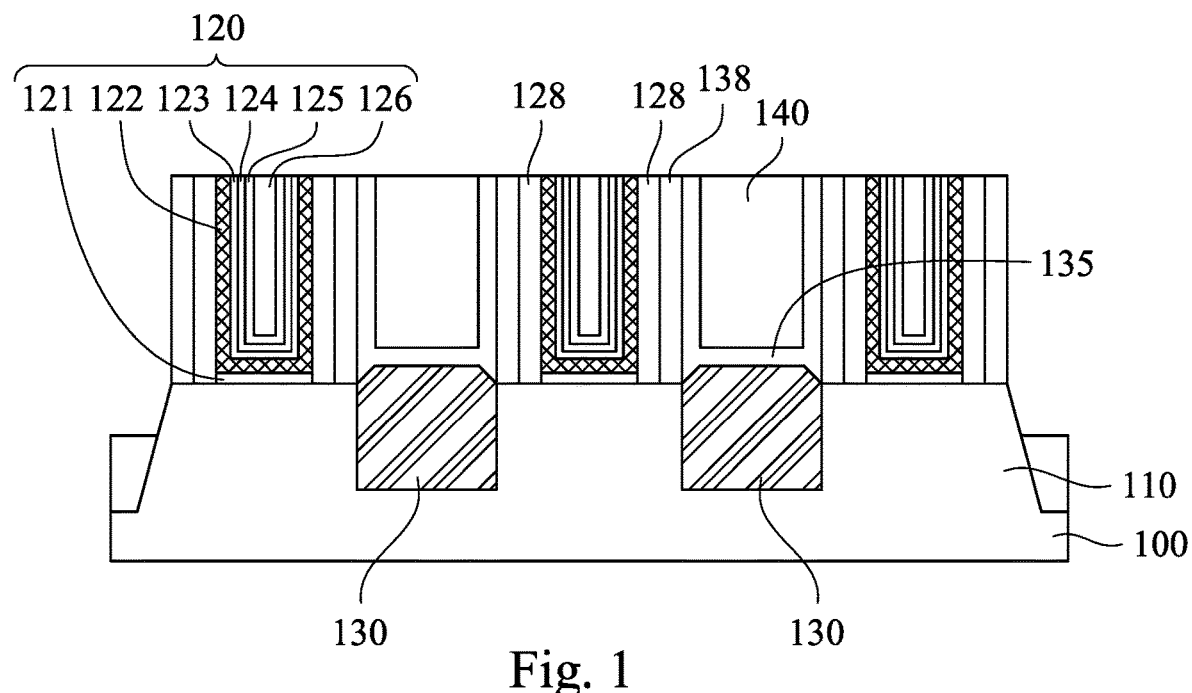
FIGS. 1 to 7 illustrate a method of manufacturing a semiconductor structure at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 7 illustrate a method of manufacturing a semiconductor structure at various stages in accordance with some embodiments.

Reference is made to FIG. 1. Shown there is a semiconductor structure. The semiconductor structure includes a substrate 100 having a semiconductor fin 110. The semiconductor fins 110 may be formed by suitable method. For example, the semiconductor fins 110 may be formed using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

Plural gate stacks 120 are disposed on the semiconductor fin 110 of the substrate 100. At least one of the gate stacks 120, in some embodiments, may include an interfacial layer 121, a gate dielectric layer 122, a capping layer 123, a first work function metal layer 124, a second work function metal layer 125, and a gate electrode 126, which can be formed by suitable processes.

The interfacial layer 121 may include dielectric material such as silicon oxide ($SiO_2$), HfSiO, and/or silicon oxynitride (SiON). The gate dielectric layer 122 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. The capping layer 123 may include titanium nitride (TiN) and/or tantalum nitride (TaN), but other materials and combinations of material layers are contemplated for the capping layer 123.

The first and second work function metal layers 124 and 125 may be n-type or p-type work function layers, or combinations thereof. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the first and second work function metal layers 124 and 125 may include the same dopant type or different dopant types. The gate electrode 126 may include tungsten (W). In some other embodiments, the gate electrode 126 includes aluminum (Al), copper (Cu) or other suitable conductive material.

A plurality of gate spacers 128 and 138 are formed on opposite sidewalls of the gate stacks 120. In greater detail, the gate spacers 128 are formed on sidewalls of the gate stacks, and the gate spacers 138 are formed on outer sidewalls of the gate spacers 128. The gate spacers 128 and 138 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like. The gate spacers 128 and 138 may be formed by methods such as CVD, plasma enhanced CVD, sputter, or the like. The gate spacers 128 and 138 may then be patterned, such as by one or more etch processes to remove horizontal portions of the gate spacers 128 and 138 from the horizontal surfaces of the structure. In some embodiments, the spacers 138 may include SiO, SiN, SiOC, and SiOCN. In some other embodiments, the spacers 138 can be omitted.

A plurality of source/drain structures 130 are disposed respectively on opposite sides of at least one of the gate stacks 120 and in the semiconductor fin 110. The source/drain structures 130 may be formed by using one or more epitaxy or epitaxial (epi) processes, such that Si features, SiGe features, and/or other suitable features can be formed in a crystalline state on the substrate 100. In some embodiments, the source/drain structures 130 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

A contact etching stop layer (CESL) 135 is disposed on the source/drain structures 130. In some embodiments, the CESL 135 may include SiN$_x$, SiO$_x$, SiON, SiC, SiCN, BN, SiBN, SiCBN, or combinations thereof. An interlayer dielectric 140 is disposed over the source/drain structures 130 and the CESL 135. In some embodiments, the interlayer dielectric 140 may include silicon oxide, oxynitride or other suitable materials. The interlayer dielectric 140 may include a single layer or multiple layers. The CESL 135 may be formed by a plasma-enhanced chemical vapor deposition (PECVD) process and/or other suitable deposition process, or an oxidation process. The interlayer dielectric 140 The ILD layer 140 may be deposited by a CVD, a PVD, or other suitable deposition technique.

Figure 2A:
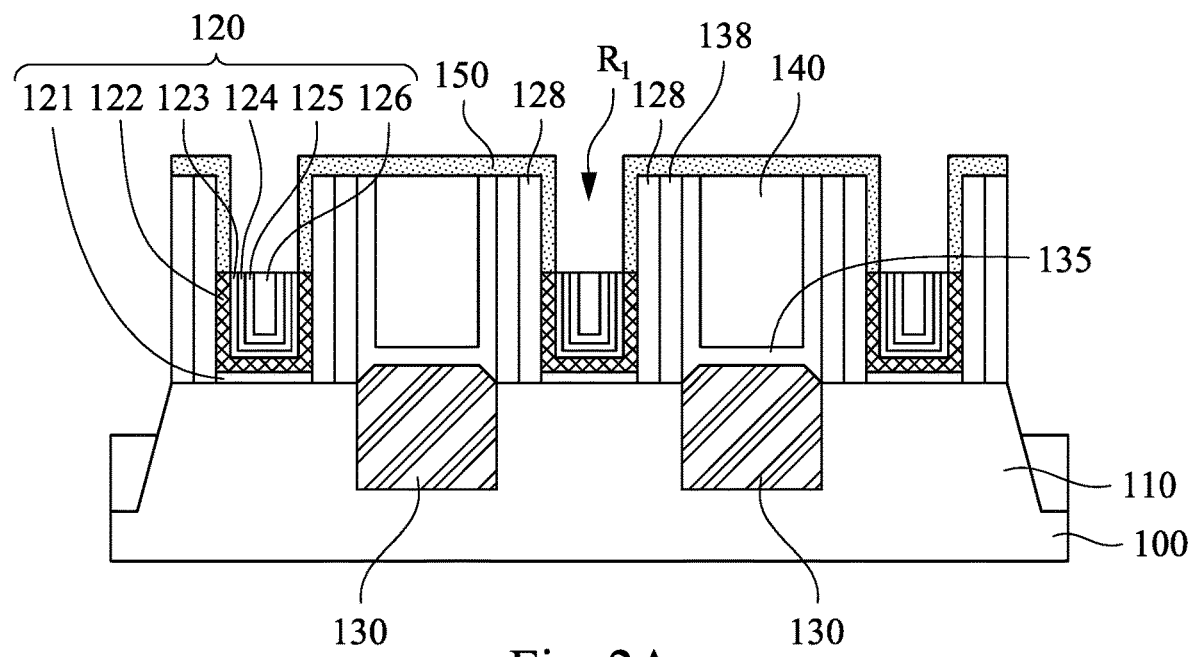
Figure 2B:
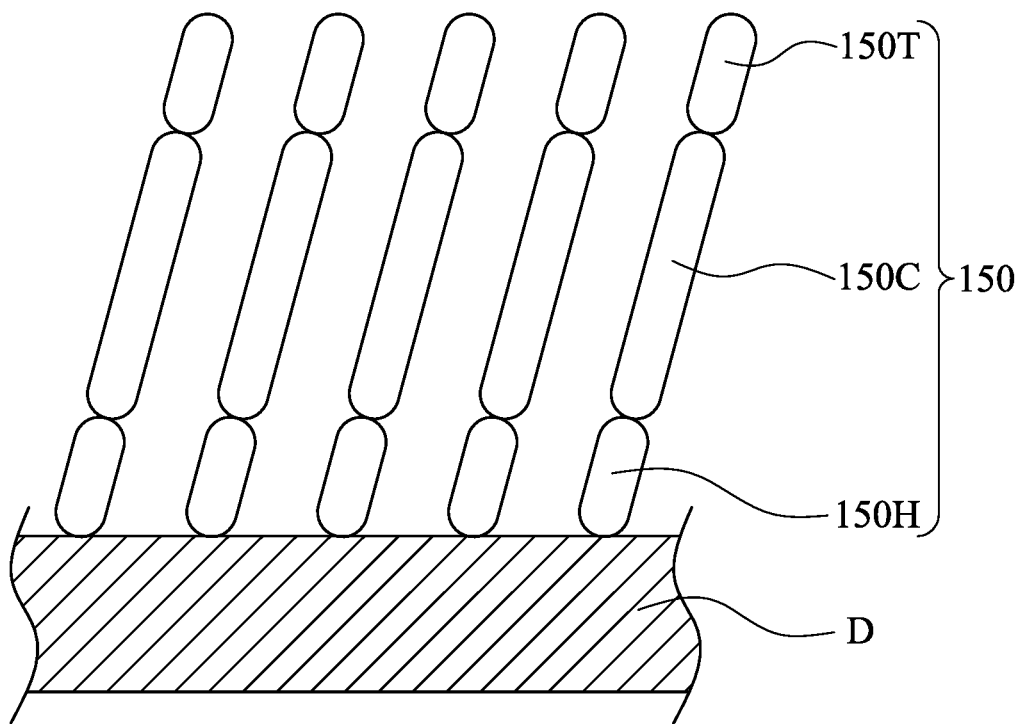

Reference is made to FIGS. 2A and 2B. The gate stacks 120 are etched back to form recesses R$_1$ between two adjacent gate spacers 128. The gate stacks 120 may be removed by suitable process, such as etching. For example, dry etching, wet etching, or combination thereof may be employed. As shown in FIG. 2A, the top surfaces of the etched gate stacks 120 are illustrated to be flat. However, in some other embodiments, the top surfaces of the etched gate stacks 120 may be craggy, because the etching process may have different etching selectivity with respect to different layers of the gate stacks 120 (i.e., the gate dielectric layer 122, the capping layer 123, etc.). In other word, the shape of the etched gate stacks 120 in FIG. 2A is merely used to explained, but the present disclosure is not limited thereto.

Then, an inhibitor 150 is formed over the substrate 100. In greater detail, the inhibitor 150 is selectively formed on dielectric materials (i.e., the gate spacers 128 and 138 and the interlayer dielectric 140 in FIG. 2A), while leaving a portion of the gate stacks 120 exposed. Furthermore, the inhibitor 150 is in contact with portions of the sidewalls of the gate spacers 128 that are exposed by the gate stacks 120. The inhibitor 150 includes a material that can suppress subsequent deposition on the dielectric materials (i.e., the gate spacers 128 and 138, and the ILD 140 in FIG. 2A).

In some embodiments, the inhibitor 150 may be formed by liquid and/or vapor deposition process. In some embodiments where the inhibitor 150 is formed by liquid deposition process, the cleaned substrates are immersed in about 10 mM solution of octadecanethiol in pure ethanol held at a controlled temperature of about 40° C. for about 30 min to about 48 hour. The substrates are then sonicated in pure ethanol and dried with nitrogen. In some embodiments where the inhibitor 150 is formed by vapor deposition process, dodecanethiol deposition is performed at about 60° C. by exposing the sample inside the chamber to about 60 mTorr pressure of DDT for times ranging from about 30 second to about 2 hour. After that, the substrates are sonicated for about 30 second in pure ethanol to remove excessive thiol molecules from the surface of the substrate, and dried under flow of nitrogen. In some other embodiments, deposition time may be in a range from about 1 second to about 24 hours and the temperature may be in a range from about 0° C. to about 300° C.

In some embodiments, the inhibitor 150 may be polymer or a self-assemble monolayer (SAM). The SAM inhibitor includes silane-type inhibitor or thiol-type inhibitor. In some embodiments, the silane-type inhibitor may be Octadecyltrichlorosilane (CH$_3$(CH$_2$)$_{17}$SiCl$_3$), Trichloro (1H, 1H, 2H, 2H-perfluorooctyl)silane (CF$_3$(CF$_2$)$_5$(CH$_2$)$_2$SiCl$_3$), Dimethyldichlorosilane ((CH$_3$)$_2$SiCl$_2$)/(Dimethylamino)trimethylsilane ((CH$_3$)$_2$NSi(CH$_3$)$_3$), 1-(Trimethylsilyl)pyrrolidine ((CH$_3$)$_3$Si—NC$_4$H$_8$), Hexamethyldisilazane ([(CH$_3$)$_3$Si]$_2$NH), or Bis(dimethylamino)dimethylsilane ([(CH$_3$)$_2$N]$_2$Si(CH$_3$)$_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, silane-type inhibitor can be selectively formed on a dielectric layer, and not formed on a metal layer. As a result, the metal portion of the gate stacks 120, such as the layers 123 to 126, are free from coverage of the inhibitor 150.

In some embodiments where the inhibitor 150 is formed of a self-assemble monolayer (SAM), the molecules of the inhibitor 150 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the inhibitor 150 includes alkyltrichlorosilanes (X—$(CH_2)_n$—$SiCl_3$), the head group can be bound to a surface of a dielectric material, rather than a surface of a metal. As such, the inhibitor 150 can be selectively formed (grown) on a specific surface of a dielectric material, while formation of the inhibitor 150 on the metal can be suppressed. Thus, the inhibitor 150 is formed on the dielectric portions of the semiconductor structure, but not on the metal portions of the semiconductor structure.

Reference is made to FIG. 2B. For example, the self-assemble monolayer (SAM) 150 is formed on a substrate D including the dielectric material, such as the gate spacers 128 and 138, and the interlayer dielectric 140 in FIG. 2A. The SAM 150 includes a head group 150H connected to a terminal group 150T (i.e., functional group) by way of a molecular chain 150C (i.e., tail). The head group 150H has a hydrophilic interfacial property that attracts the SAM 150 to the substrate D that is made of dielectric material. In some embodiments, the head group 150H may include trichlorosilicon ($SiCl_3$) or trimethoxysilane ($Si(OCH_3)_3$), which provide the hydrophilic interfacial property. In some embodiments, the molecular chain 150C may include an alkyl chain, such as methylene $(CH_2)_n$, for example. The terminal group 150T has a hydrophobic interfacial property that repels metal, thereby preventing metal from adhering to the SAM 150. In some embodiments, the terminal group 150T may include a methyl group ($CH_3$), which provides the hydrophobic interfacial property.

Figure 3:
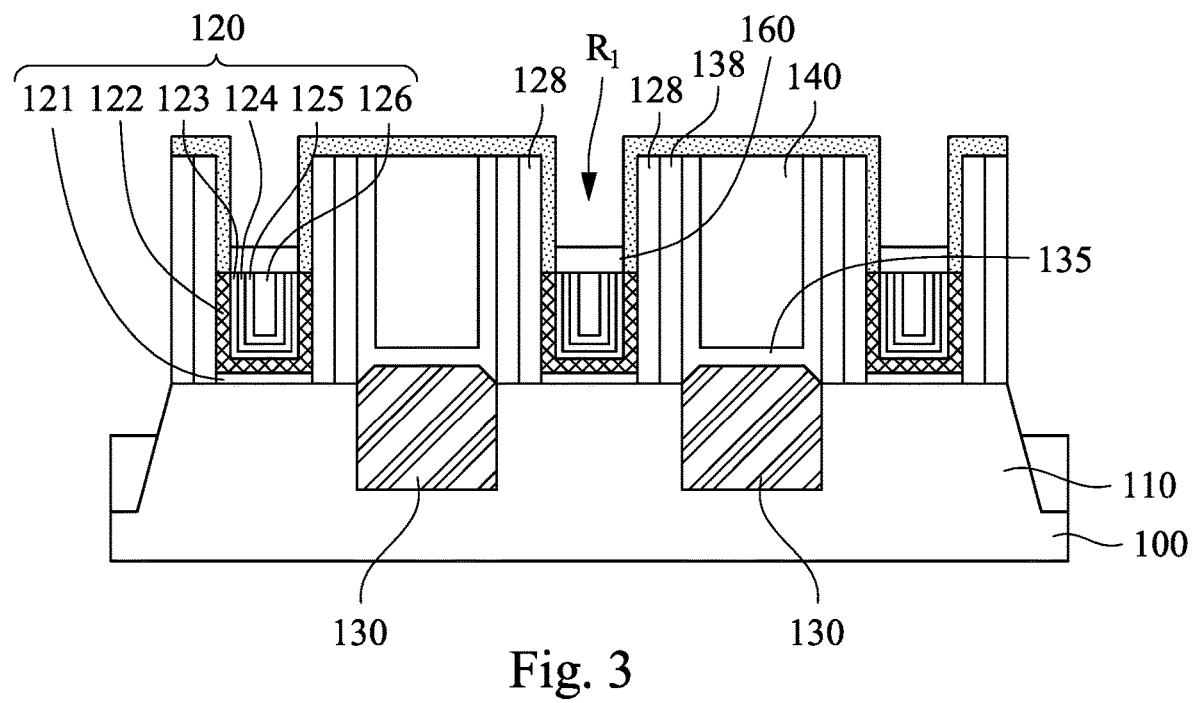

Reference is made to FIG. 3. An atomic layer deposition (ALD) process is employed to form a conductive layer 160 self-aligned to the exposed surfaces of the gate stacks 120. The ALD process employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles.

Due to the material properties of the inhibitor 150, e.g., the metal repellence property of the terminal group 150T of the inhibitor 150 in FIG. 2B, precursors of the ALD process have a tendency not to adhere to the surface of the inhibitor 150. Specifically, the terminal groups 150T of the inhibitor 150 is substantially inert with the precursors of the ALD process, and the middle portions of the inhibitor 150 form a good coverage to block the precursors (forming steric hindrance) from reacting with the structure covered by the inhibitor 150. The precursors of the ALD process have high selectivity between the inhibitor 150 and the gate stacks 120. Specifically, the ALD process has selectivity for the gate stacks 120 with respect to the inhibitor 150. As used herein, deposition of a material A on a material B is "selective to" a material C indicates that if the deposition process deposits the material A on the material B at a rate that is at least twice the rate of deposition of the material A on the material C. The ratio of the rate of deposition on the material B to the rate of deposition on the material C is herein referred to as a "selectivity" of the deposition process for the material B with respect to the material C. Moreover, the ALD selectivity for the gate stacks 120 with respect to the inhibitor 150 is greater than an ALD selectivity for the gate stacks 120 with respect to the dielectric materials. As such, by forming the inhibitor 150, the deposition rate of the conductive layer 160 over the dielectric materials (on the inhibitor 150) can be efficiently suppressed.

Thus, during the ALD process, the conductive layer 160 may be formed on the gate stacks 120, but not on the top surface of the inhibitor 150. It is noted that since the inhibitor 150 is formed on the exposed sidewalls of the gate spacers 128, the conductive layer 160 adheres to the top surfaces of the recessed gate stacks 120 and is then formed in a bottom-up manner. The inhibitor 150 enables the conductive layer 160 to have improved filling characteristics in the remaining recess $R_1$, and therefore results in a continuous void-free self-aligned contact (SAC) by facilitating filling of the remaining recess $R_1$ for forming the SAC without leaving unfilled voids therein. The voids generated in a SAC may deteriorate an electrical characteristic and reliability of the device, increase the resistance of the gate, and/or weaken the structural integrity of the gate. Therefore, this configuration can improve the abovementioned problems. In some embodiments, the conductive layer 160 can be a metal, such as W, TiN, Co, Ru, PT, or other suitable metal.

Figure 4:
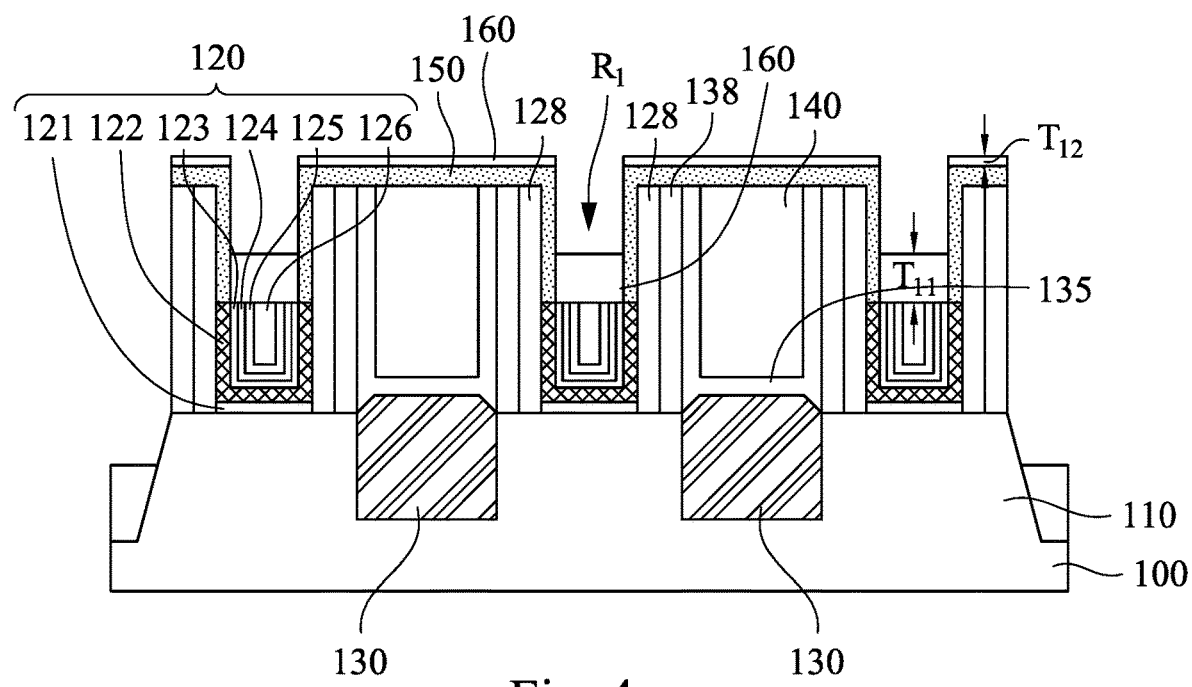

Reference is made to FIG. 4. However, after plural reaction cycles of the ALD process, the conductive layer 160 may start to form on the inhibitor 150. As illustrated, a portion of the conductive layer 160 over the gate stacks 120 has a thickness $T_{11}$, and another portion of the conductive layer 160 over the inhibitor 150 has a thickness $T_{12}$, in that the thickness $T_{11}$ is greater than the thickness $T_{12}$. Stated another way, due to material properties of the inhibitor 150 and the gate stacks 120, the conductive layer 160 has greater growing rate on the gate stacks 120 than on the inhibitor 150. In some embodiments, the number of reaction cycles of the ALD process may be in a range from about 1 to about 100.

Figure 5:
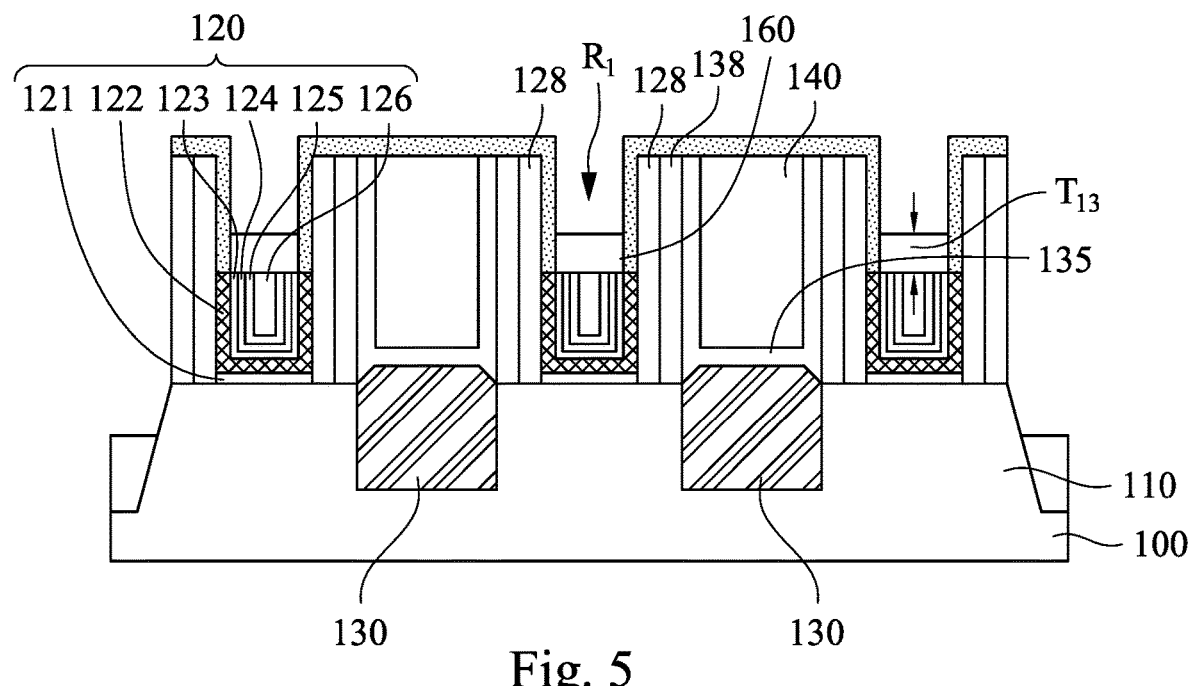

Reference is made to FIG. 5. An atomic layer etching (ALE) process is performed to remove the conductive layer 160 over the inhibitor 150. That is, the unwanted conductive layer 160 formed on the inhibitor 150 is removed during the ALE process, so as to expose the surface of the inhibitor 150. ALE technology enables the controlled removal of material from a substrate, layer-by-layer, where the etching thickness is on the order of magnitude of a monolayer. Self-limited reaction is a characteristic of ALE. Adsorption and desorption operations are self-limited at a maximum rate equivalent to monolayer per cycle. Specifically, the ALE reaction cycle sequentially includes forming an adsorption monolayer including an etchant on an exposed surface of a substrate, purging the chamber to remove the excess etchant that does not react with the substrate, desorbing the adsorption monolayer by exposing the adsorption monolayer to gas ions to activate a reaction of the etchant, and purging the chamber to remove the desorbed monolayer. The total amount of material removed is determined by the number of repeated reaction cycles. As such, the etching thickness of the material can be well controlled. The enchant in every cycle can be the same or different.

After the ALE process, the portion of the conductive layer 160 over the gate stacks 120 has a thickness $T_{13}$. During the ALE process, the portion of the conductive layer 160 over the gate stacks 120 is partially removed. In some embodiments, the thickness of the removed portion of the conductive layer 160 over the gate stacks 120 is substantially equal to the removed thickness of the conductive layer 160 over the inhibitor 150. In other words, the thicknesses $T_{11}$ (referring to FIG. 4), $T_{12}$ (referring to FIG. 4), and $T_{13}$ substantially satisfy: $T_{13}=T_{11}-T_{12}$. In some embodiments, the thickness $T_{13}$ is in a range from about 10 nm to about 100 nm. The ALE process may include plural reaction cycles to remove a desired thickness of the conductive layer 160. In some embodiments, the number of the reaction cycles of the ALE may be in a range from about 1 to about 50.

In some embodiments, etchants of the ALE process may include $O_2$, Ar, $H_2$ plasma, or the like. In some other embodiments, etchants of the ALE process may include Cl-based gas or F-based gas. For example, the Cl-based gas may be $Cl_2$, $BCl_3$, or the like. The F-based gas may be $CF_4$, $C_4F_8$, $CH_3F$, $CH_2F_2$, $CHF_3$, $CF_x$, $NF_3$, or the like. In some other embodiments, etchants of the ALE process may include ion bombardment. For example, the ion of the ion bombardment may be Ar, He, or the like.

The ALD process and the ALE process discussed in FIGS. 3 to 5 may be regarded as a formation cycle for forming the conductive layer 160 over the gate stacks 120 having thickness $T_{13}$, and with the inhibitor 150 uncovered. The formation cycle may be expressed by the following equation:

$$X*(\text{ALD reaction cycle})+Y*(\text{ALE reaction cycle})=1*(\text{formation cycle})$$

In other words, a formation cycle includes performing X times of ALD cycle and Y times of ALE cycle. In some embodiments, the ratio of X to Y (X/Y) is in a range from about 1 to about 15. In some other embodiments, X is greater than Y, and thus the ratio of X to Y (X/Y) is greater than 1.

Figure 6:
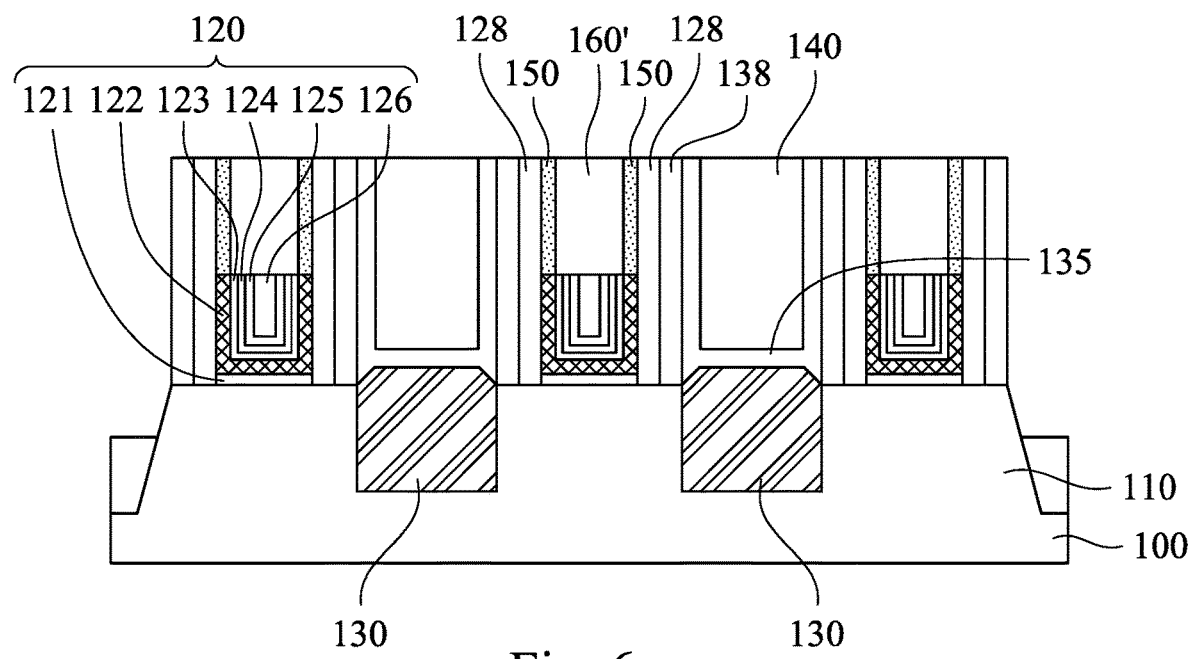

Reference is made to FIG. 6. The processes discussed in FIGS. 3 to 5 are repeated plural times (or performed in an alternating manner) to form the conductive layer 160'. In other words, the formation cycle of the conductive layer 160 of FIGS. 3 to 5 is repeated to form the conductive layer 160'. In some embodiments, the number Z of the formation cycle may be in a range from about 100 to about 1000. In some other embodiments, the number Z of the formation cycle may be in a range from about 100 to about 500. The values of X (the number of the ALD reaction cycles) in different formation cycles can be different or the same, and/or the values of Y (the number of the ALE reaction cycles) in different formation cycles can be different or the same. For example, X1 ALD reaction cycles, Y1 ALE reaction cycles, X2 ALD reaction cycles, and Y2 ALE reaction cycles are sequentially performed, where X1 and X2 are different or the same, and/or Y1 and Y2 are different or the same. In FIG. 6, since the conductive layer 160' is self-aligned to the exposed surface of the gate stacks 120 in a bottom-up manner, and is not formed on the dielectric material (i.e., gate spacers 128 and 138, and ILD 140) that is covered by the inhibitor 150, a planarization process (such as a CMP process) can be skipped to avoid material loss.

Then, the inhibitor 150 (referring to FIG. 5) is removed to expose the top surface of the gate spacers 128 and 138, and the ILD 140. It is noted that portions of the inhibitor 150 remain between the gate spacers 128 and the conductive layer 160' and on the gate stacks 120. That is, the inhibitor 150 is in contact with the gate spacers 128, the conductive layer 160', and the gate stacks 120. The inhibitor 150 may be removed by baking or etching process. In some embodiments where the inhibitor 150 is removed by baking, the baking temperature may be in a range of about 1° C. to about 60° C. to decompose C—H bonding of the inhibitor 150. Then, the decomposed portion of inhibitor 150 may be washed by dilute acidic solution, such as $H_3PO_4$, HCl, or other suitable solutions. In some other embodiments where the inhibitor 150 is removed by etching, the etchants may include $CF_3$, $C_4F_6$, $CHF_3$, $CH_2F_2$, $CH_3F$, $NF_3$, or other suitable materials.

Figure 7:
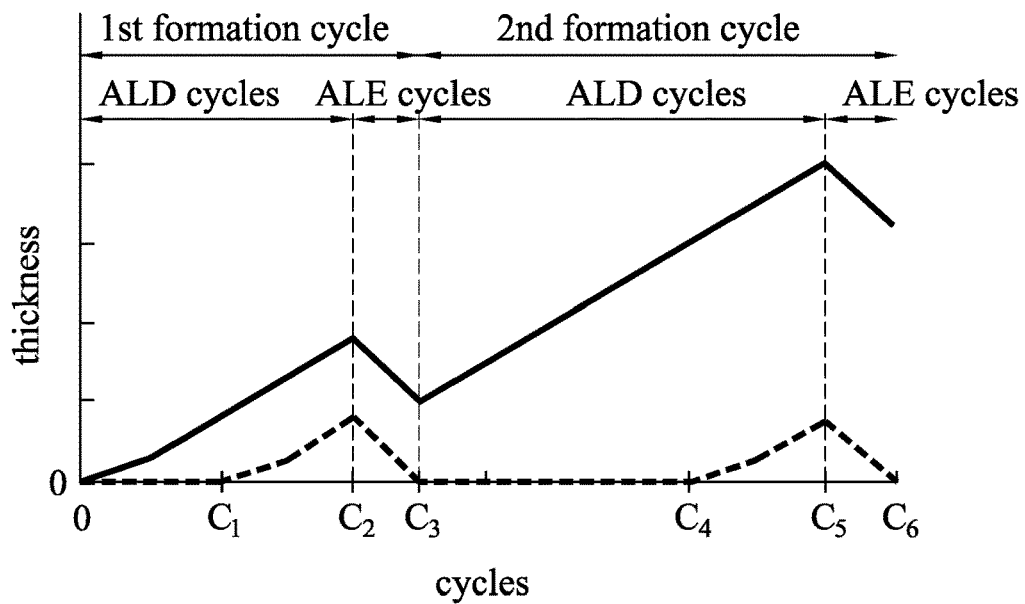

Reference is made to FIG. 7. FIG. 7 illustrates a formation diagram in conjunction with FIGS. 3 to 5 where the vertical axis represents the thickness of the conductive layer 160, and the horizontal axis represents the reaction cycles of the ALD process and ALE process. In FIG. 7, the solid line represents the thickness of the conductive layer 160 formed on the metal portion of the gate stacks 120 (see FIG. 3), and the dash line represents the thickness of the conductive layer 160 formed on the inhibitor 150 (see FIG. 4). At the beginning, plural ALD reaction cycles are performed. While after C1 cycles of the ALD reaction cycles, the conductive layer 160 starts to form on the inhibitor 150 (as illustrated that the slope of the dash line gets increased). After C2 cycles of the ALD reaction cycles, plural cycles of ALE process are performed to remove the conductive layer 160 on the inhibitor 150. The ALE reaction cycles may undergo C3–C2 times until the thickness of the conductive layer 160 on the inhibitor 150 is reduced to 0. However, the conductive layer 160 on the gate stacks 120 still remain sufficient thickness (i.e., thickness $T_{13}$ of FIG. 5). The combination of the ALD cycles (C2 cycles) and the ALE cycles (C3–C2) may be referred to as a first formation cycle.

Then, a second formation cycle is performed to further increase the thickness of the conductive layer 160. In the second formation cycle, C5–C3 cycles of ALD are performed to form the conductive layer 160, while the conductive layer 160 starts to form on the inhibitor 150 after C4–C3 cycles of ALD are performed. Similarly, C6–C5 cycles of ALE are performed to remove unwanted conductive layer 160 on the inhibitor 150. As a result, after the first and second formation cycles, the conductive layer 160 on the gate stacks 120 may have a certain thickness, but the top surface of the inhibitor 150 is free from coverage of the conductive layer 160. In FIG. 7, two formation cycles are illustrated, while it is noted that several formation cycles may be performed to obtain a desired thickness of the conductive layer 160.

FIGS. 8 to 13 illustrate a method of manufacturing a semiconductor structure at various stages in accordance with some embodiments.

Figure 8:
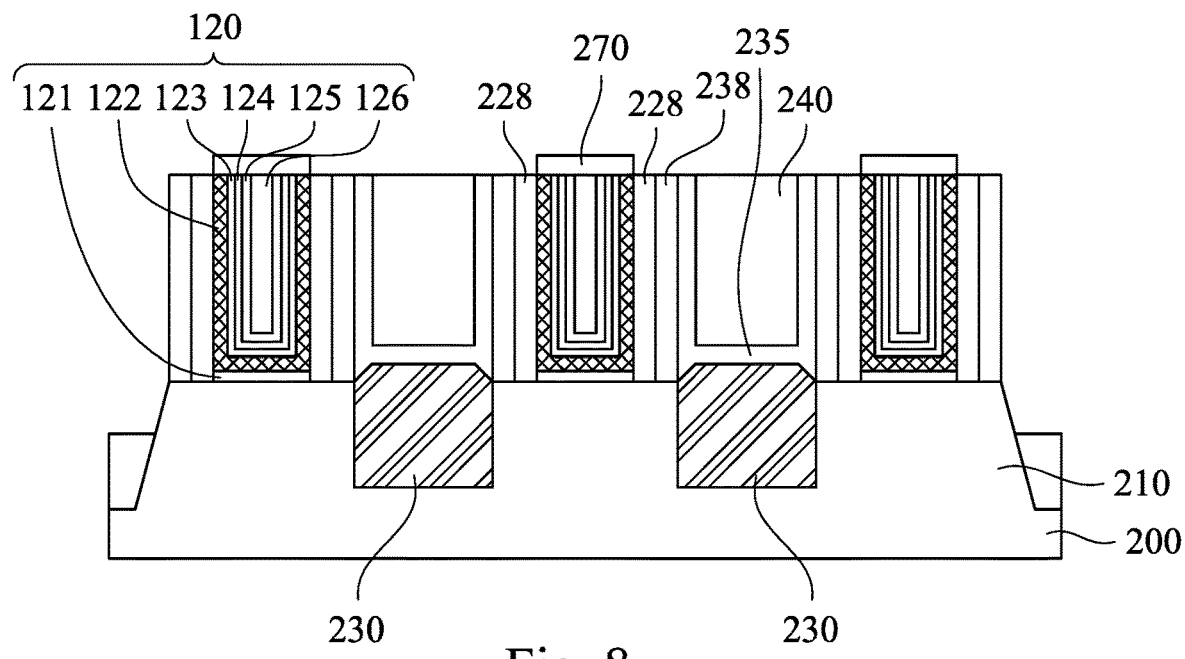
FIGS. 8 to 13 illustrate a method of manufacturing a semiconductor structure at various stages in accordance with some embodiments.

Reference is made to FIG. 8, in which the structure of FIG. 8 is similar to that described in FIG. 1, and thus relevant structural details will not be repeated hereinafter. For example, a semiconductor structure includes a substrate 200 having a semiconductor fin 210, gate stacks 220, gate spacers 228 and 238, source/drain structures 230, CESL 235, and ILD 240. The gate stacks 220 includes an interfacial layer 221, a gate dielectric 222, a capping layer 223, a first work function metal layer 224, a second work function metal layer 225, and a gate electrode 226.

In some embodiments, a metal layer 270 is formed on and covers the gate stacks 220 so as to provide selectivity for forming an inhibitor in a later stage. In other words, the gate spacers 228 and 238, and the ILD 240 are exposed from the metal layer 270. The metal layer 270 may be formed by suitable process, such as forming a metal-containing layer blanket over the semiconductor structure, and followed by a patterning process to remove unwanted portion of the metal-containing layer to form the metal layer 270. In some embodiments, the metal layer 270 may include W, TiN, Co, Ru, Pt, or other suitable metals.

Figure 9A:
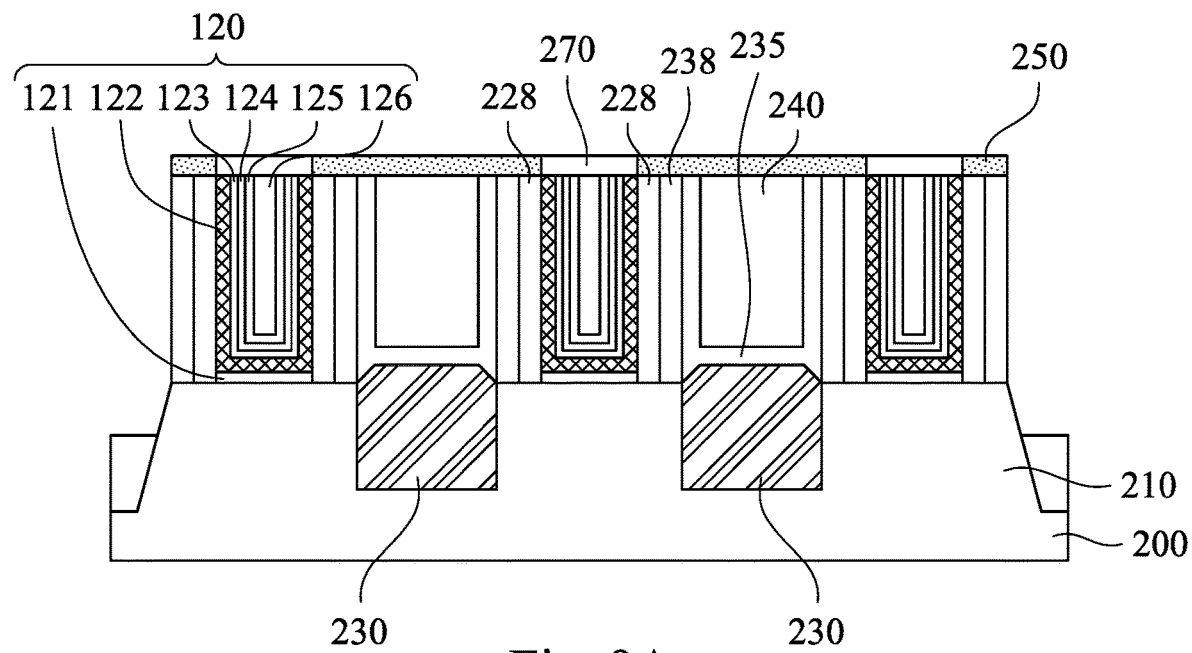
Figure 9B:
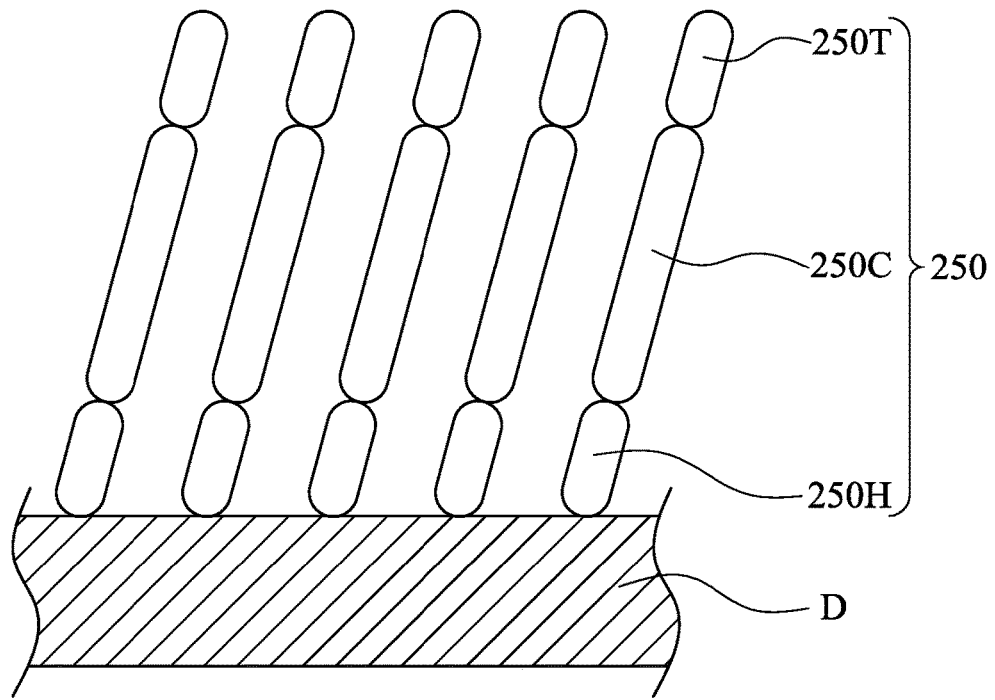

Reference is made to FIGS. 9A and 9B. An inhibitor 250 is selectively formed over the substrate 200 and covering the gate spacers 228 and 238, and the ILD 240. In greater detail, the inhibitor 250 is selectively formed on the gate spacers 228 and 238, and the ILD 240, and not on the top surface of the metal layer 270. The inhibitor 250 includes a material that can suppress subsequent deposition on the dielectric materials (i.e., the gate spacers 228 and 238, and the ILD 240 in FIG. 9A). In some embodiments, the inhibitor 250 may be formed by liquid and/or vapor deposition process. The formation of the inhibitor 250 is similar to inhibitor 150 of FIGS. 2A and 2B.

In some embodiments, the inhibitor 250 may be polymer or a self-assemble monolayer (SAM). The SAM inhibitor includes silane-type inhibitor or thiol-type inhibitor. In some embodiments, the silane-type inhibitor may be Octadecyltrichlorosilane ($CH_3(CH_2)_{17}SiCl_3$), Trichloro(1H, 1H, 2H, 2H-perfluorooctyl)silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si-NC_4H_8$), Hexamethyldisilazane ($[(CH_3)_3Si]_2NH$), or Bis(dimethylamino)dimethylsilane ($[(CH_3)_2N]_2Si(CH_3)_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, silane-type inhibitor can be selectively formed on a dielectric layer, and not formed on a metal layer. As a result, the metal layer 270 is free from coverage of the inhibitor 250.

In some embodiments where the inhibitor 250 is formed of a self-assemble monolayer (SAM), the molecules of the inhibitor 250 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the inhibitor 250 includes alkyltrichlorosilanes (X—$(CH_2)_n$—$SiCl_3$), the head group can be bound to a surface of a dielectric material, rather than a surface of a metal. As such, the inhibitor 250 can be selectively formed (grown) on a specific surface of a dielectric material, while formation of the inhibitor 250 on the metal can be suppressed.

Reference is made to FIG. 9B. For example, the self-assemble monolayer 250 is formed on a substrate D including the dielectric material, such as gate spacers 228 and 238, and the ILD 240 in FIG. 9A. The SAM 250 includes a head group 250H connected to a terminal group 250T (i.e., functional group) by way of a molecular chain 250C (i.e., tail). The head group 250H has a hydrophilic interfacial property that attracts the SAM 250 to the substrate D that is made of dielectric material. In some embodiments, the head group 250H may include trichlorosilicon ($SiCl_3$) or trimethoxysilane ($Si(OCH_3)_3$), which provide the hydrophilic interfacial property. In some embodiments, the molecular chain 250C may include an alkyl chain, such as methylene ($CH_2)_n$, for example. The terminal group 250T has a hydrophobic interfacial property that repels metal, thereby preventing metal from adhering to the SAM 250. In some embodiments, the terminal group 250T may include a methyl group ($CH_3$), which provides the hydrophobic interfacial property.

Figure 10:
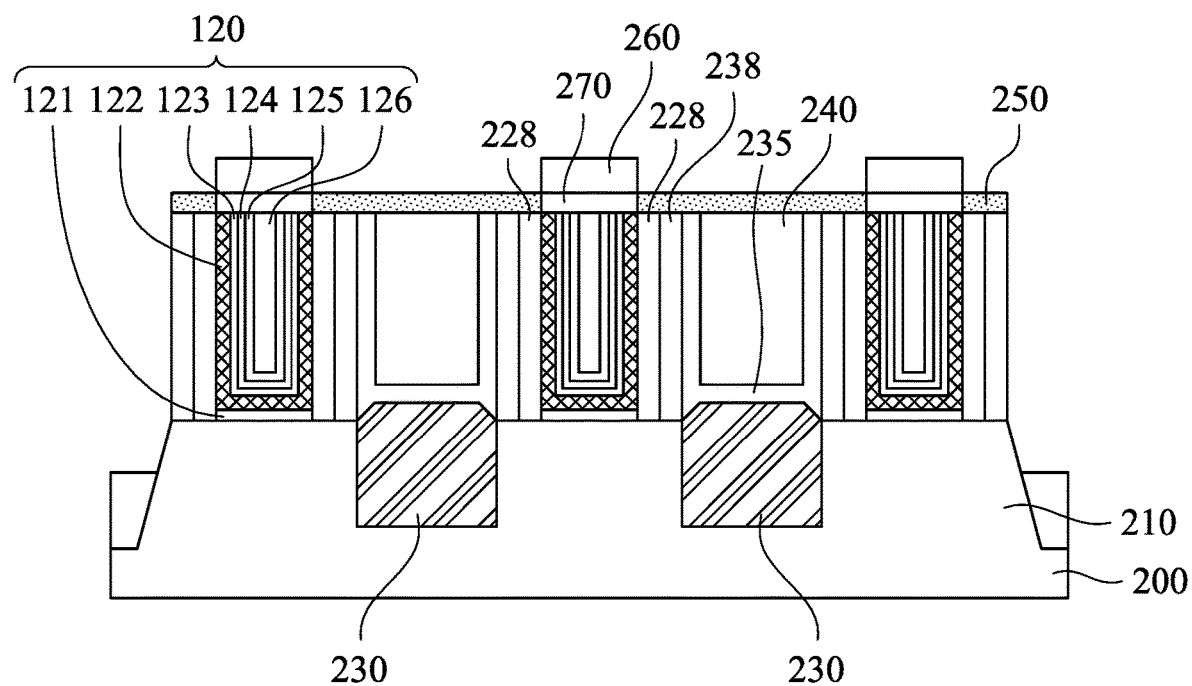

Reference is made to FIG. 10. An atomic layer deposition (ALD) process is employed to form a conductive layer 260 self-aligned to the metal layer 270. Due to the material properties of the inhibitor 250 as discussed above, precursors of the ALD process have a tendency not to adhere to the surface of the inhibitor 250. Thus, during the ALD process, the conductive layer 260 may be formed over the metal layer 270, but leaving the top surface of the inhibitor 250 uncovered.

Figure 11:
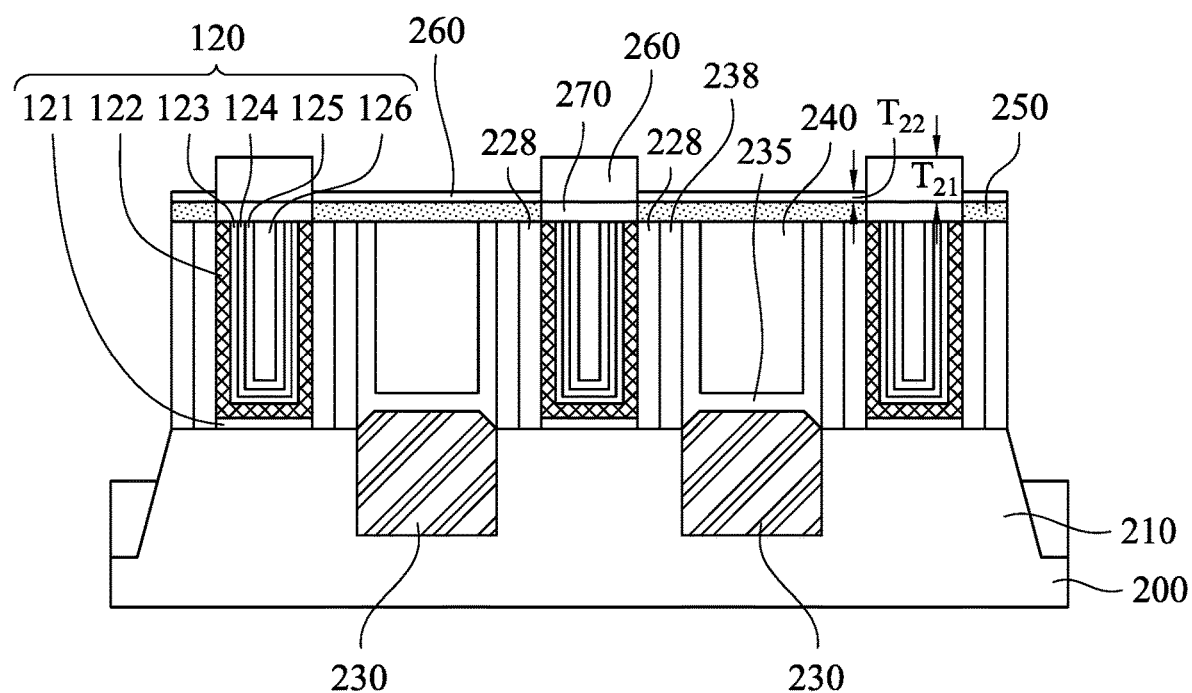

Reference is made to FIG. 11. However, after plural reaction cycles of the ALD process, the conductive layer 260 may start to form on the inhibitor 250. As illustrated, a portion of the conductive layer 260 over the metal layer 270 has a thickness $T_{21}$, and another portion of the conductive layer 260 over the inhibitor 250 has a thickness $T_{22}$, in that thickness $T_{21}$ is greater than thickness $T_{22}$. From other perspectives, due to material properties, the conductive layer 260 has a greater growing rate on the metal layer 270 than on the inhibitor 250. In some embodiments, the number of reaction cycles of the ALD process may be in a range from about 1 to about 100.

Figure 12:
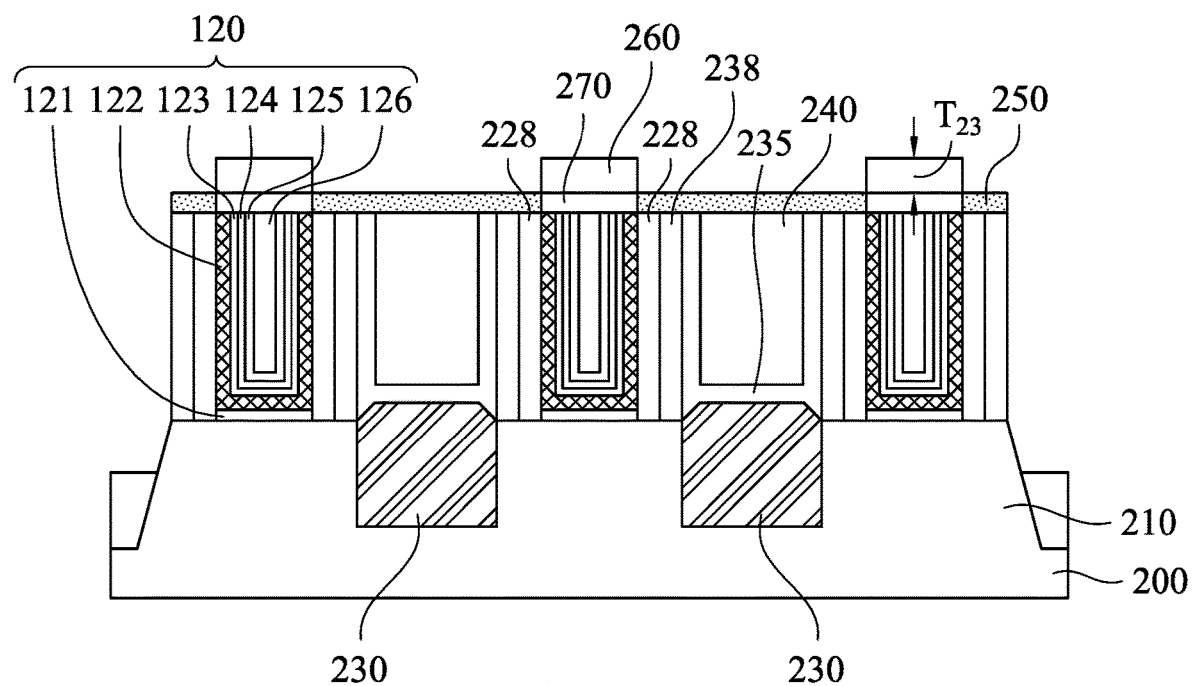

Reference is made to FIG. 12. An atomic layer etching (ALE) process is performed to remove the conductive layer 260 over the inhibitor 250. That is, the unwanted conductive layer 260 formed on the inhibitor 250 is removed during the ALE process, so as to expose the surface of the inhibitor 250. After the ALE process, the portion of the conductive layer 260 over the metal layer 270 has a thickness $T_{23}$. During the ALE process, the portion of the conductive layer 260 over the metal layer 270 is partially removed. In some embodiments, the thickness of the removed portion of the conductive layer 260 over the metal layer 270 is substantially equal to the removed thickness of the conductive layer 260 over the inhibitor 250. In other words, the thicknesses $T_{21}$ (referring to FIG. 11), $T_{22}$ (referring to FIG. 11), and $T_{23}$ substantially satisfy: $T_{23}=T_{21}-T_{22}$. In some embodiments, the thickness $T_{23}$ is in a range from about 10 nm to about 100 nm. The ALE process may include plural reaction cycles to remove a desired thickness of the inhibitor 250. In some embodiments, the number of the reaction cycles of the ALE may be in a range from about 1 to about 50.

The ALD process and the ALE process discussed in FIGS. 10 to 12 may be regarded as a formation cycle for forming the conductive layer 260 over the metal layer 270 having thickness $T_{23}$, and with the inhibitor 250 uncovered. The formation cycle may be expressed by the following equation:

$$X*(\text{ALD reaction cycle}) + Y*(\text{ALE reaction cycle}) = 1*(\text{formation cycle})$$

In other words, a formation cycle includes performing X times of ALD cycle and Y times of ALE cycle. In some embodiments, the ratio of X to Y (X/Y) is in a range from about 1 to about 15. In some other embodiments, X is greater than Y, and thus the ratio of X to Y (X/Y) is greater than 1.

Figure 13:
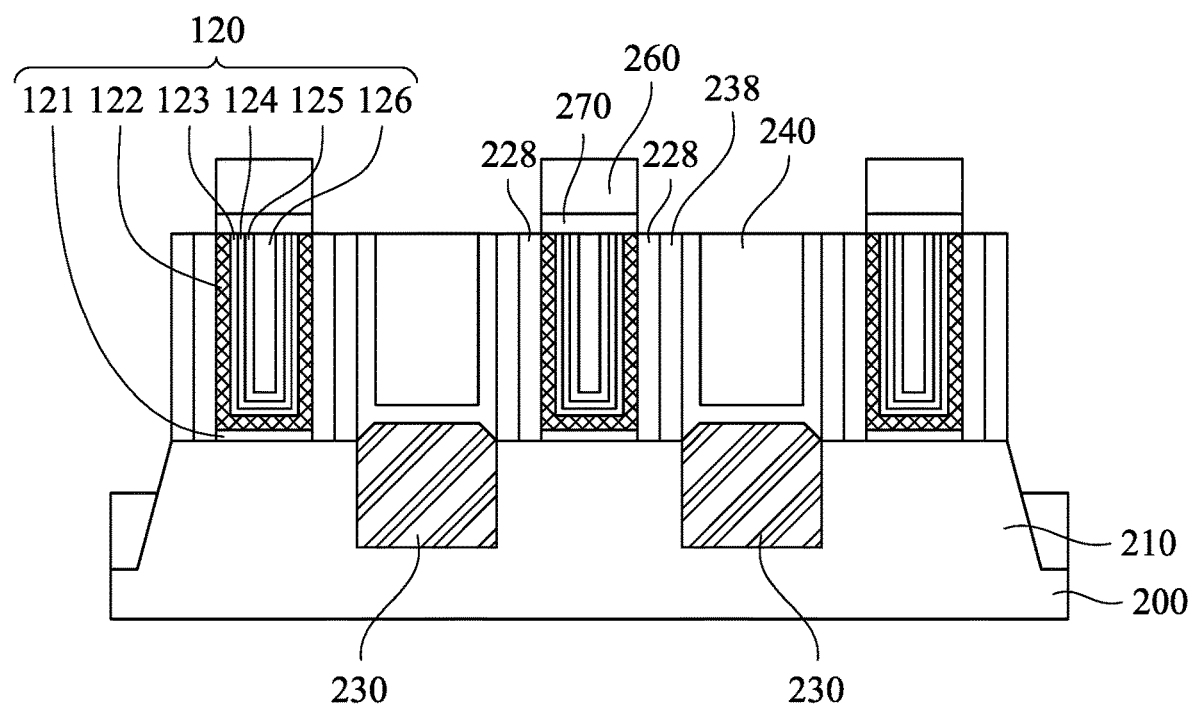

Reference is made to FIG. 13. The processes discussed in FIGS. 10 to 12 are repeated plural times (or performed in an alternating manner) to form the conductive layer 260'. In other words, the formation cycle of the conductive layer 260 of FIGS. 10 to 12 is repeated to form the conductive layer 260'. In FIG. 13, the conductive layer 260' is referred to as a self aligned contact (SAC). In some embodiments, the number Z of the formation cycle may be in a range from about 100 to about 1000. In some other embodiments, the number Z of the formation cycle may be in a range from about 100 to about 500. The formation principle of the dielectric layer 260' is similar to that described in FIG. 7, and will not be repeated for simplicity.

Then, the inhibitor 250 (referring to FIG. 12) is removed to expose the top surface of the gate spacers 228 and 238, and the interlayer dielectric 240. The removal of the inhibitor 250 is the same or similar to that of the inhibitor 150 of FIG. 6, and will not be repeated for simplicity.

FIGS. 14 to 19 illustrate a method of manufacturing a semiconductor structure at various stages in accordance with some embodiments.

Figure 14:
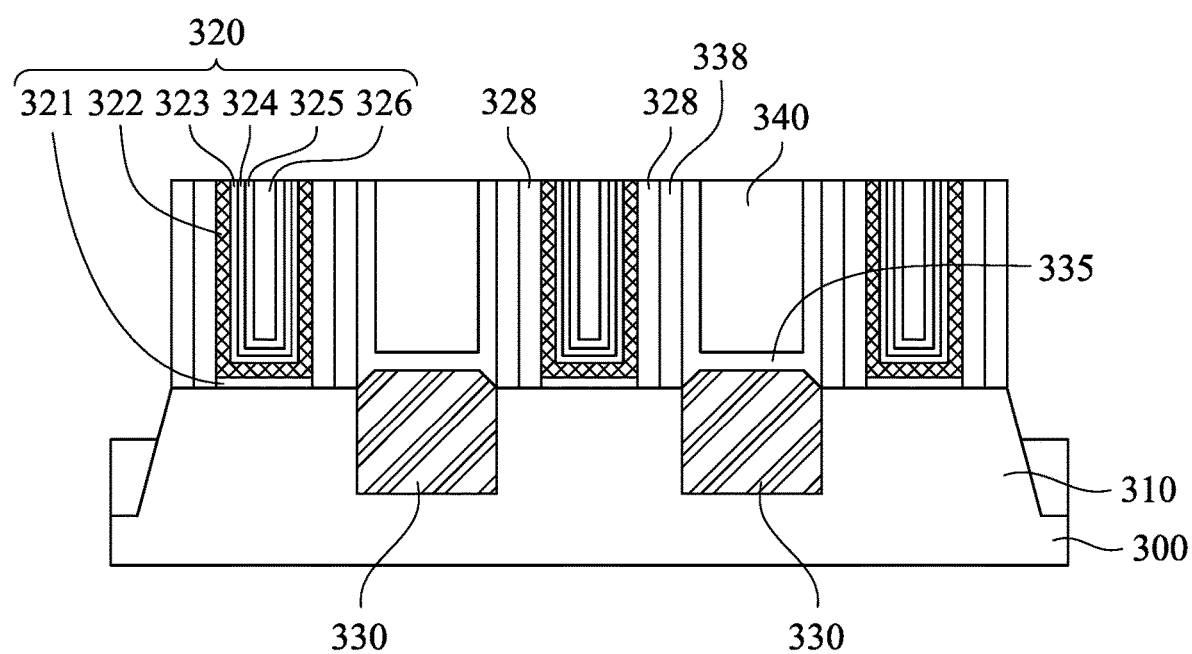
FIGS. 14 to 19 illustrate a method of manufacturing a semiconductor structure at various stages in accordance with some embodiments.

Reference is made to FIG. 14, in which the structure of FIG. 14 is similar to that described in FIG. 1, and thus relevant structural details will not be repeated hereinafter. For example, a semiconductor structure includes a substrate 300 having a semiconductor fin 310, gate stacks 320, gate spacers 328 and 338, source/drain structures 330, CESL 335, and ILD 340. The gate stacks 320 includes an interfacial layer 321, a gate dielectric 322, a capping layer 323, a first work function metal layer 324, a second work function metal layer 325, and a gate electrode 326.

Figure 15A:
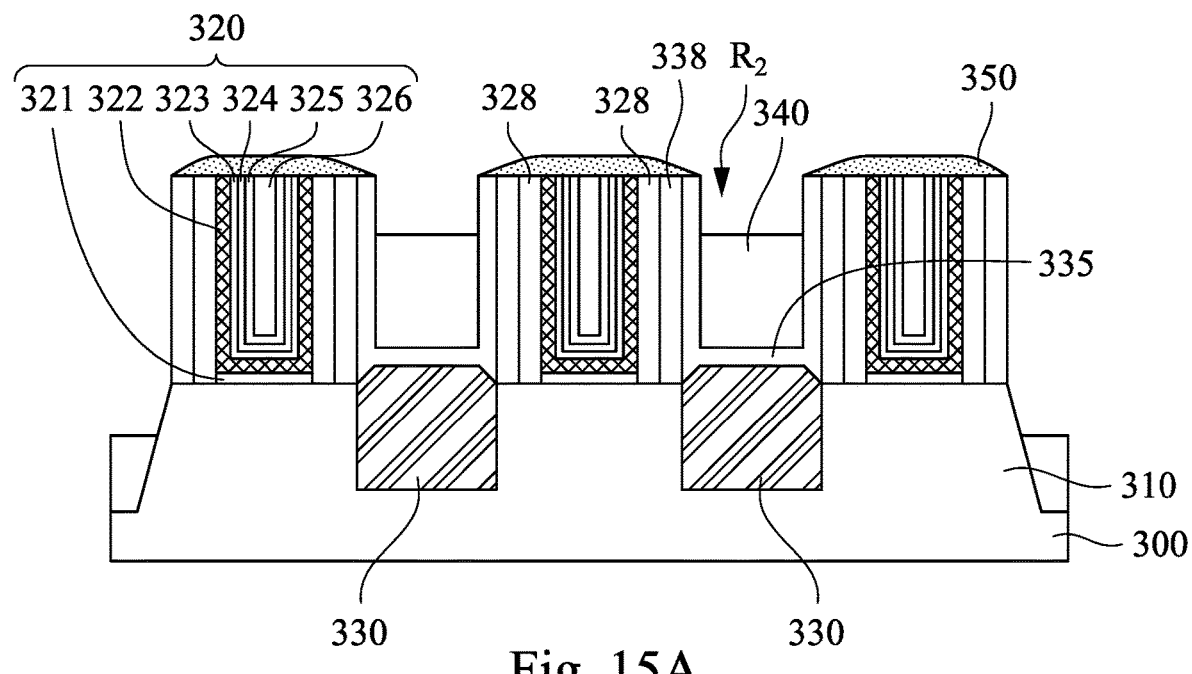
Figure 15B:
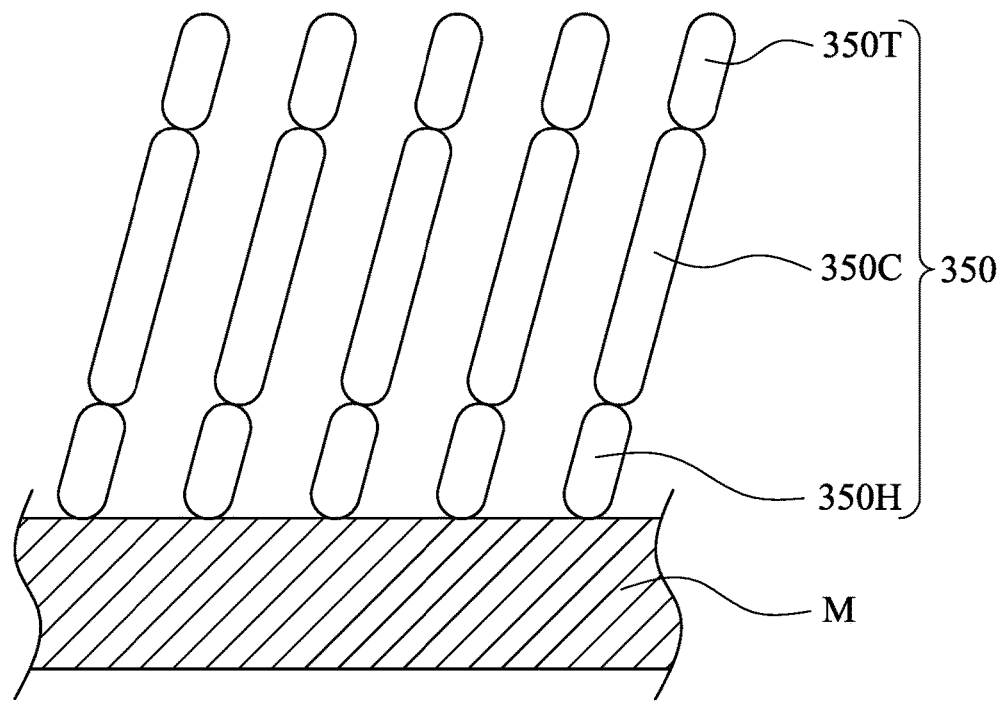

Reference is made to FIGS. 15A and 15B. The ILD 340 is partially removed to form recesses $R_2$ between the CESL 335. The ILD 340 may be removed by suitable process, such as etching. An inhibitor 350 is formed over the gate stacks 320, the gate spacers 328 and 338, and CESL 335. In other words, the top surfaces of the ILD 340 are exposed from the inhibitor 350.

In some embodiments, the inhibitor 350 may be polymer or self-assemble monolayer (SAM). The SAM inhibitor includes silane-type inhibitor or thiol-type inhibitor. In some embodiments, the silane-type inhibitor may be Octadecyl-trichlorosilane ($CH_3(CH_2)_{17}SiCl_3$), Trichloro(1H, 1H, 2H, 2H-perfluorooctyl)silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si$—$NC_4H_8$), Hexamethyldisilazane ($[(CH_3)_3Si]_2$NH), or Bis(dimethylamino)dimethylsilane ($[(CH_3)_2N]_2Si(CH_3)_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, thiol-type inhibitor can be selectively formed on a metal layer, and not formed on a dielectric layer.

In some embodiments where the inhibitor 350 is a self-assemble monolayer (SAM), the molecules of the inhibitor 350 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the inhibitor 350 includes alkanethiols (X—$(CH_2)_n$—SH), the head group can be bound to a surface of a metal material. As such, the inhibitor 350 can be selectively formed (grown) on a metal layer and not on a dielectric layer.

Reference is made to FIG. 15B. For example, the self-assemble monolayer 350 is formed on a substrate M including metal. The SAM 350 includes a head group 350H connected to a terminal group 350T (i.e., functional group) by way of a molecular chain 350C (i.e., tail). The head group 350H has a hydrophilic interfacial property that attracts the SAM 350 to the substrate M. In some embodiments, the head group 350H may include sulfhydryl or thiol, which provide the hydrophilic interfacial property. In some embodiments, the molecular chain 350C may include an alkyl chain, such as methylene $(CH_2)_n$, for example. The terminal group 350T has a hydrophobic interfacial property that repels metal, thereby preventing metal from adhering to the SAM 350. In some embodiments, the terminal group 350T may include a methyl group ($CH_3$), which provides the hydrophobic interfacial property.

As discussed above, the inhibitor 350 is mainly formed self-aligned to a metal surface, such as the gate stacks 320. However, if the deposition time is long enough, the inhibitor 350 may start to form on the dielectric surface adjacent to the metal surface. In other words, the inhibitor 350 on the metal surface may overflow to the dielectric regions adjacent to the metal surface. As an example, in FIG. 15A, the deposition time of the inhibitor 350 may be controlled to further form the inhibitor 350 covering the adjacent regions of the gate stacks 320, such as the gate spacers 328 and 338, and the CESL 335. Accordingly, the portion of the inhibitor 350 on the gate stacks 320 is thicker than the portion of the inhibitor 350 on the gate spacers 328 and 338, and the CESL 335, because the inhibitor 350 is initially formed on the gate stacks 320 and then overflow to the adjacent dielectric material. It is note that the deposition time of the inhibitor 350 is controlled such that the inhibitor 350 is not formed on the surface that is intended to form a dielectric layer (i.e., the dielectric layer 360 in FIG. 16) thereon. For example, the inhibitor 350 may cover the gate stacks 320, the gate spacers 328 and 338, while leaving the top surface of the CESL 335 and the ILD 340 exposed. In some other embodiments, the inhibitor 350 may formed on the metal portions of the gate stacks 320 (i.e., layers 323 to 326), and not formed on the adjacent dielectric surface (i.e., gate dielectric 322, gate spacers 328 and 338, and CESL 335). It is understood that the shape of the inhibitor 350 in FIG. 15A is merely used to explain, and is not intended to limit the present disclosure.

Figure 16:
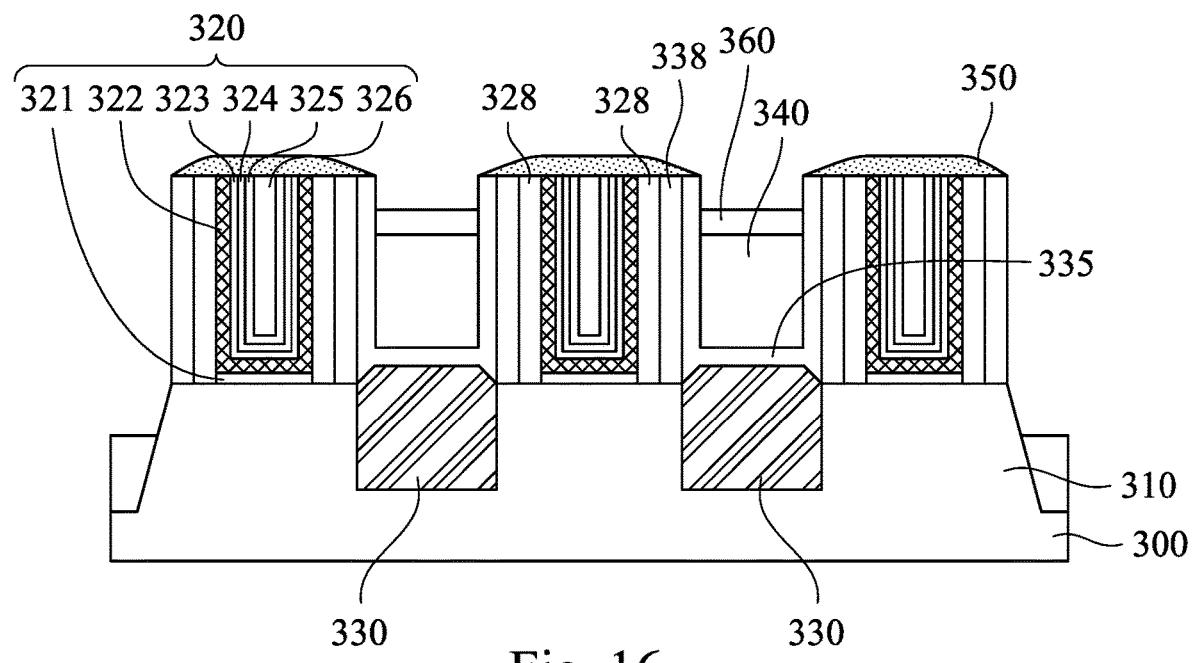

Reference is made to FIG. 16. An atomic layer deposition (ALD) process is employed to form a dielectric layer 360 over the interlayer dielectric 340. Due to the material properties of the inhibitor 350, precursors of the ALD process have a tendency not to adhere to the surface of the inhibitor 350. Thus, during the ALD process, the dielectric layer 360 may be formed over the interlayer dielectric 340, but leaving the top surface of the inhibitor 350 uncovered.

Figure 17:
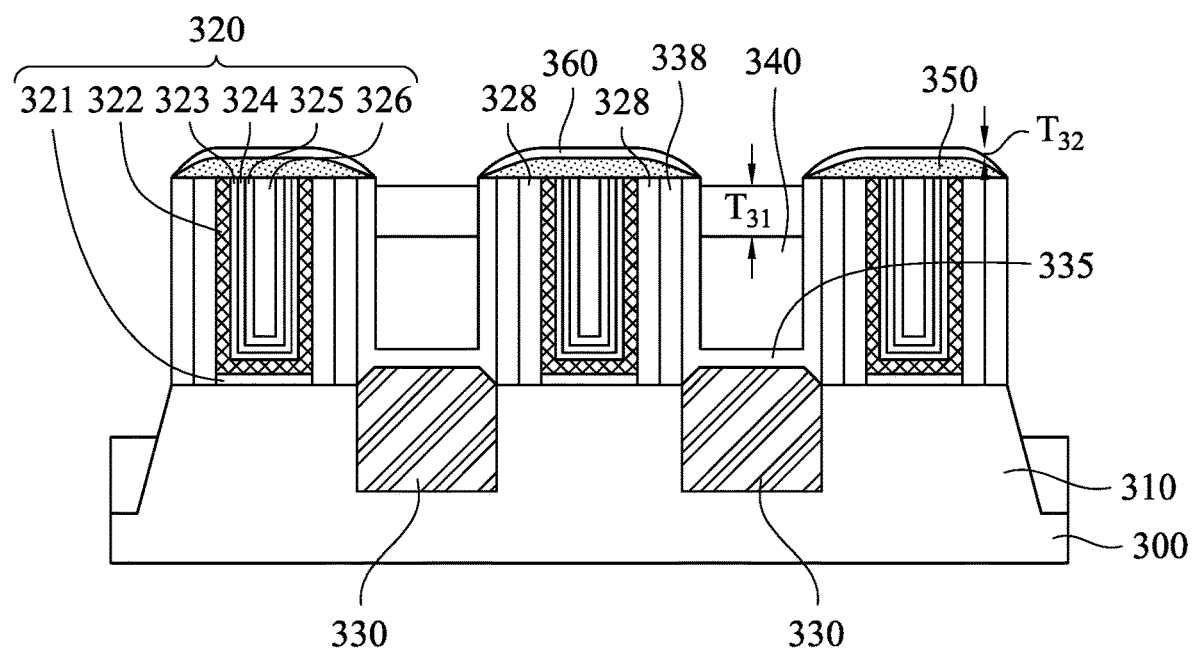

Reference is made to FIG. 17. However, after plural reaction cycles of the ALD process, the dielectric layer 360 may start to form on the inhibitor 350. As illustrated, a portion of the dielectric layer 360 over the interlayer dielectric 340 has a thickness $T_{31}$, and another portion of the dielectric layer 360 over the inhibitor 350 has a thickness $T_{32}$, in that thickness $T_{31}$ is greater than thickness $T_{32}$. From other perspectives, due to material properties of the inhibitor 350, the dielectric layer 360 has greater growing rate on the interlayer dielectric 340 than on the inhibitor 350. In some embodiments, the number of reaction cycles of the ALD process may be in a range from about 1 to about 100.

Figure 18:
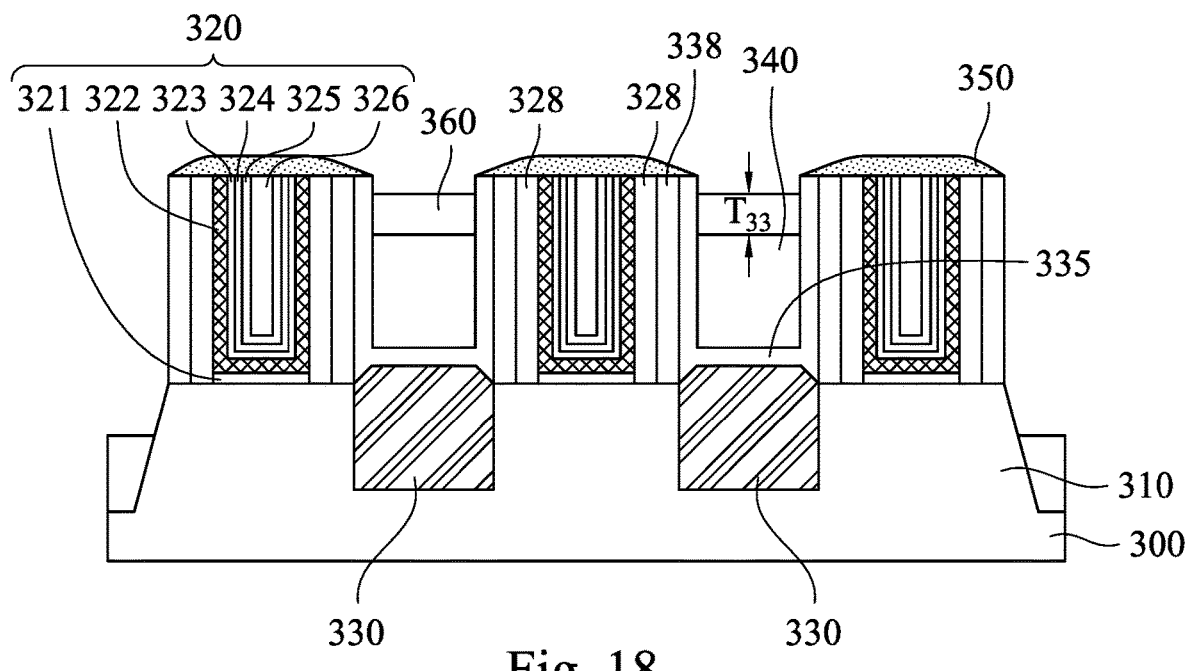

Reference is made to FIG. 18. An atomic layer etching (ALE) process is performed to remove the dielectric layer 360 over the inhibitor 350. That is, the unwanted dielectric layer 360 formed on the inhibitor 350 is removed during the ALE process, so as to expose the surface of the inhibitor 350 After the ALE process, the portion of the dielectric layer 360 over the interlayer dielectric 340 has a thickness $T_{33}$. During the ALE process, the portion of the dielectric layer 360 over the interlayer dielectric 340 is partially removed. In some embodiments, the thickness of the removed portion of the dielectric layer 360 over the interlayer dielectric 340 is substantially equal to the removed thickness of the dielectric layer 360 over the inhibitor 350. In other words, the thicknesses $T_{31}$ (referring to FIG. 17), $T_{32}$ (referring to FIG. 17), and $T_{33}$ substantially satisfy: $T_{33}=T_{31}-T_{32}$. In some embodiments, the thickness $T_{33}$ is in a range from about 10 nm to about 100 nm. The ALE process may include plural reaction cycles to remove a desired thickness of the inhibitor 350. In some embodiments, the number of the reaction cycles of the ALE may be in a range from about 1 to about 50.

The ALD process and the ALE process discussed in FIGS. 16 to 18 may be regarded as a formation cycle for forming the dielectric layer 360 over the interlayer dielectric 340 having thickness $T_{33}$, and with the inhibitor 350 uncovered. The formation cycle may be expressed by the following equation:

$$X*(\text{ALD reaction cycle})+Y*(\text{ALE reaction cycle})=1*(\text{formation cycle})$$

In other words, a formation cycle includes performing X times of ALD cycle and Y times of ALE cycle. In some embodiments, the ratio of X to Y (X/Y) is in a range from about 1 to about 15. In some other embodiments, X is greater than Y, and thus the ratio of X to Y (X/Y) is greater than 1.

Figure 19:
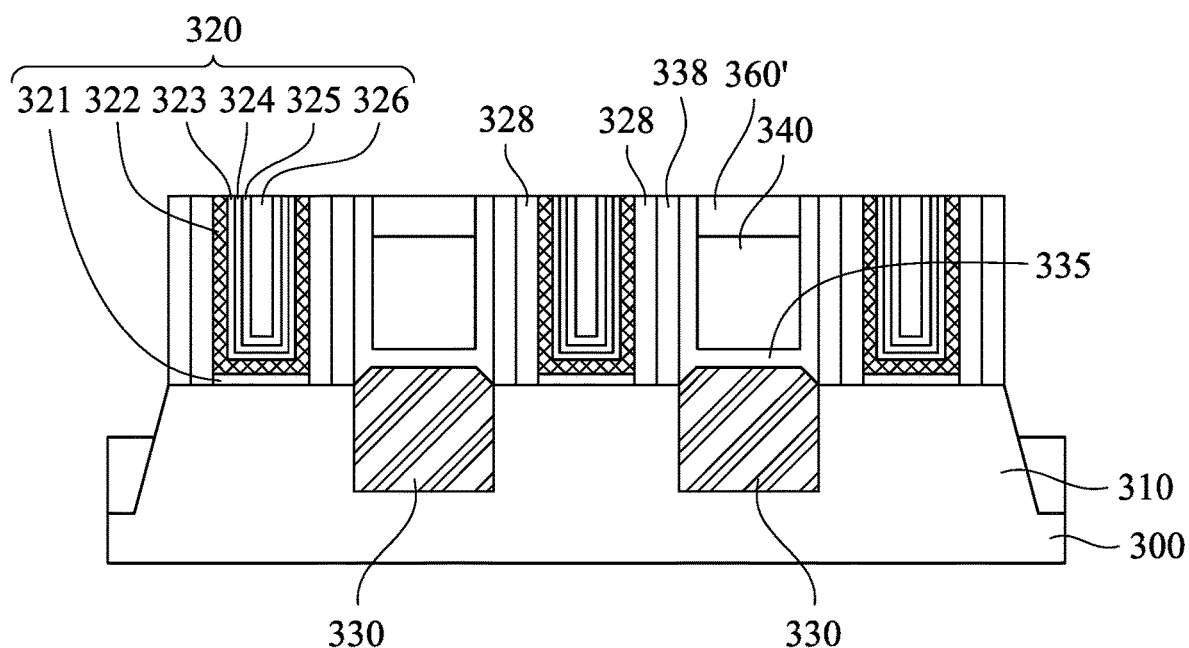

Reference is made to FIG. 19. The processes discussed in FIGS. 16 to 18 are repeated plural times (or performed in an alternating manner) to form the dielectric layer 360'. In other words, the formation cycle of the dielectric layer 360 of FIGS. 16 to 18 is repeated to form the dielectric layer 360'. In FIG. 19, the dielectric layer 360' can be referred to as a hard mask layer. In some embodiments, the number Z of the formation cycle may be in a range from about 100 to about 1000. In some other embodiments, the number Z of the formation cycle may be in a range from about 100 to about 500. The formation principle of the dielectric layer 360' is similar to that described in FIG. 7, and will not be repeated for simplicity.

Then, the inhibitor 350 (referring to FIG. 18) is removed to expose the top surface of the gate stacks 320, the gate spacers 328 and 338, and the CESL 335. The removal of the inhibitor 350 is the same or similar to that of the inhibitor 150 of FIG. 6, and will not be repeated for simplicity. In some embodiments, an etching back process (not shown) may be performed to remove a portion of the gate stacks 320. During the etching back process, the hard mask layer 360' may be used as a mask to protect the material below (i.e., the ILD 340) from being etched.

FIGS. 20 to 25 illustrate a method of manufacturing a semiconductor structure at various stages in accordance with some embodiments.

Figure 20:
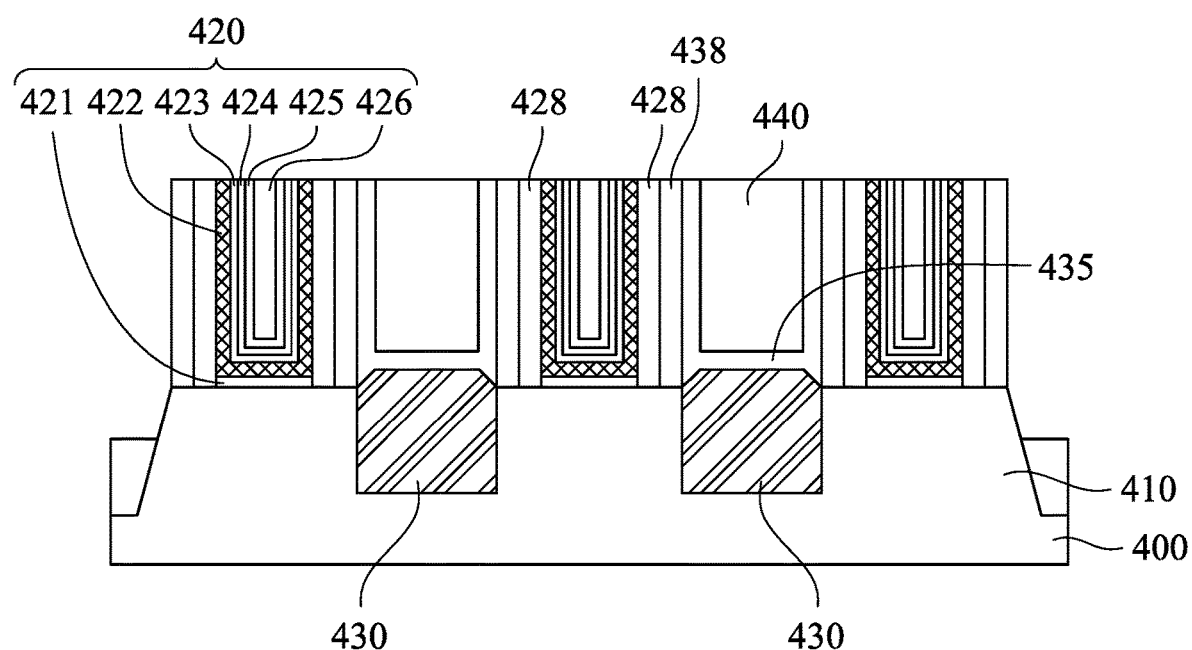
FIGS. 20 to 25 illustrate a method of manufacturing a semiconductor structure at various stages in accordance with some embodiments.

Reference is made to FIG. 20, in which the structure of FIG. 20 is similar to that described in FIG. 1, and thus relevant structural details will not be repeated hereinafter. For example, a semiconductor structure includes a substrate 400 having a semiconductor fin 410, gate stacks 420, gate spacers 428 and 438, source/drain structures 430, CESL 435, and ILD 440. The gate stacks 420 includes an interfacial layer 421, a gate dielectric 422, a capping layer 423, a first work function metal layer 424, a second work function metal layer 425, and a gate electrode 426.

Figure 21A:
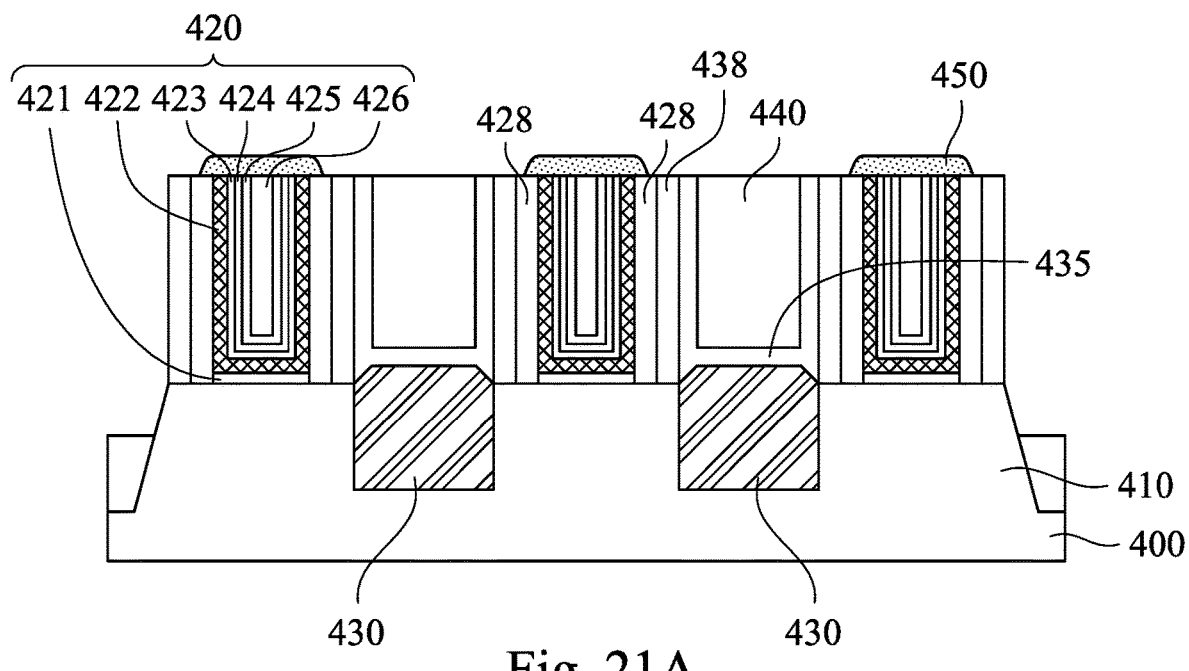
Figure 21B:
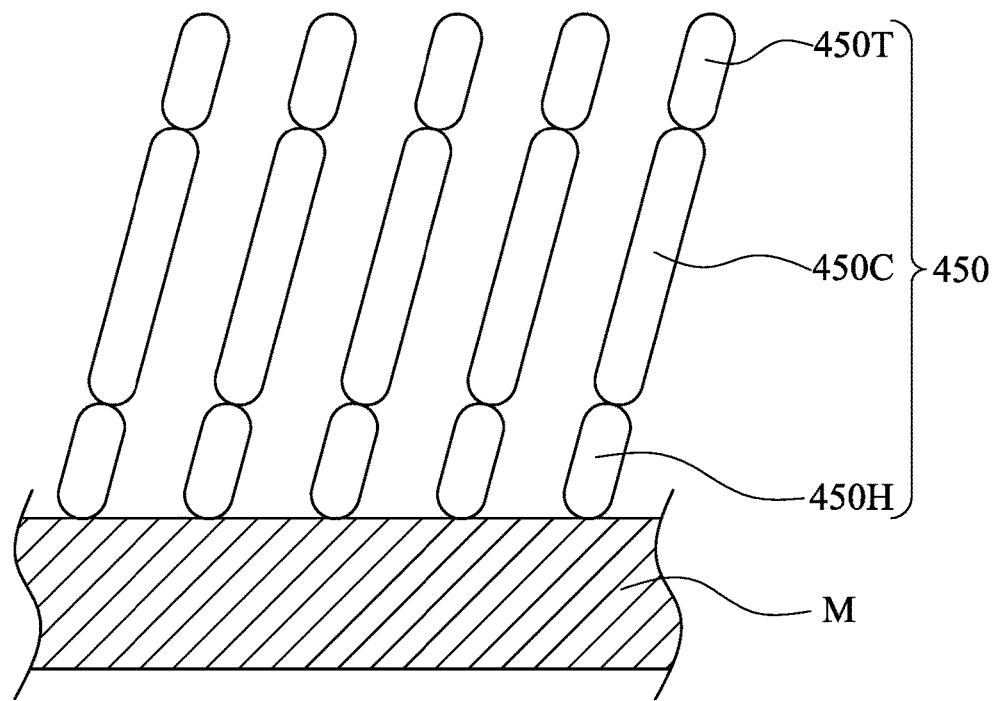

Reference is made to FIGS. 21A and 21B. An inhibitor 450 is formed over the gate stacks 420. In some embodiments, the inhibitor 450 covers a portion of the gate spacers 428, and the reason will be discussed later.

In some embodiments, the inhibitor 450 may be polymer or self-assemble monolayer (SAM). The SAM inhibitor includes silane-type inhibitor or thiol-type inhibitor. In some embodiments, the silane-type inhibitor may be Octadecyltrichlorosilane $(CH_3(CH_2)_{17}SiCl_3)$, Trichloro(1H, 1H, 2H, 2H-perfluorooctyl)silane $(CF_3(CF_2)_5(CH_2)_2SiCl_3)$, Dimethyldichlorosilane $((CH_3)_2SiCl_2)/(\text{Dimethylamino})$trimethylsilane $((CH_3)_2NSi(CH_3)_3)$, 1-(Trimethylsilyl)pyrrolidine $((CH_3)_3Si\!-\!NC_4H_8)$, Hexamethyldisilazane $([(CH_3)_3Si]_2NH)$, or Bis(dimethylamino)dimethylsilane $([(CH_3)_2N]_2Si(CH_3)_2)$. In some other embodiments, the thiol-type inhibitor may be alkanethiol, propanethiol, butanethiol, hexanethiol, heptanethiol, Octadecanethiol, nonanethiol, or dodecanethiol. In some embodiments, thiol-type inhibitor can be selectively formed on a metal layer, and not formed on a dielectric layer.

In some embodiments where the inhibitor 450 is a self-assemble monolayer (SAM), the molecules of the inhibitor 450 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the inhibitor 450 includes alkanethiols $(X\!-\!(CH_2)_n\!-\!SH)$, the head group can be bound to a surface of a metal material. As such, the inhibitor 450 can be selectively formed (grown) on a metal layer and not on a dielectric layer.

Reference is made to FIG. 21B. For example, the self-assemble monolayer 450 is formed on a substrate M including metal. The SAM 450 includes a head group 450H connected to a terminal group 450T (i.e., functional group) by way of a molecular chain 450C (i.e., tail). The head group 450H has a hydrophilic interfacial property that attracts the SAM 450 to the substrate M. In some embodiments, the head group 450H may include sulfhydryl or thiol, which provide the hydrophilic interfacial property. In some embodiments, the molecular chain 450C may include an alkyl chain, such as methylene $(CH_2)_n$, for example. The terminal group 450T has a hydrophobic interfacial property that repels metal, thereby preventing metal from adhering to the SAM 450. In some embodiments, the terminal group 450T may include a methyl group $(CH_3)$, which provides the hydrophobic interfacial property.

As discussed above, the inhibitor 450 is mainly formed self-aligned to a metal surface, such as the gate stacks 420. However, if the deposition time is long enough, the inhibitor 450 may start to form on the dielectric surface adjacent to the metal surface. In other words, the inhibitor 450 on the metal surface may overflow to the dielectric regions adjacent to the metal surface. As an example, in FIG. 21A, the deposition time of the inhibitor 450 may be controlled to further form the inhibitor 450 covering the adjacent regions of the gate stacks 420, such as the gate spacers 428. Accordingly, the portion of the inhibitor 450 on the gate stacks 420 is thicker than the portion of the inhibitor 450 on the gate spacers 428, because the inhibitor 450 is initially formed on the gate stacks 420 and then overflow to the gate spacers 428. It is note that the deposition time of the inhibitor 450 is controlled such that the inhibitor 450 is not formed on the surface that is intended to form a dielectric layer (i.e., the dielectric layer 460 in FIG. 22) thereon. For example, the inhibitor 450 may cover the gate stacks 420 and the gate spacers 428, while leaving the top surfaces of the gate spacer 438, the CESL 435, and the ILD 440 exposed. In some other embodiments, the inhibitor 450 may formed on the metal portions of the gate stacks 420 (i.e., layers 423 to 426), and not formed on the adjacent dielectric surface (i.e., gate dielectric 422, gate spacers 428 and 438, and CESL 435). It is understood that the shape of the inhibitor 450 in FIG. 21A is merely used to explain, and is not intended to limit the present disclosure.

Figure 22:
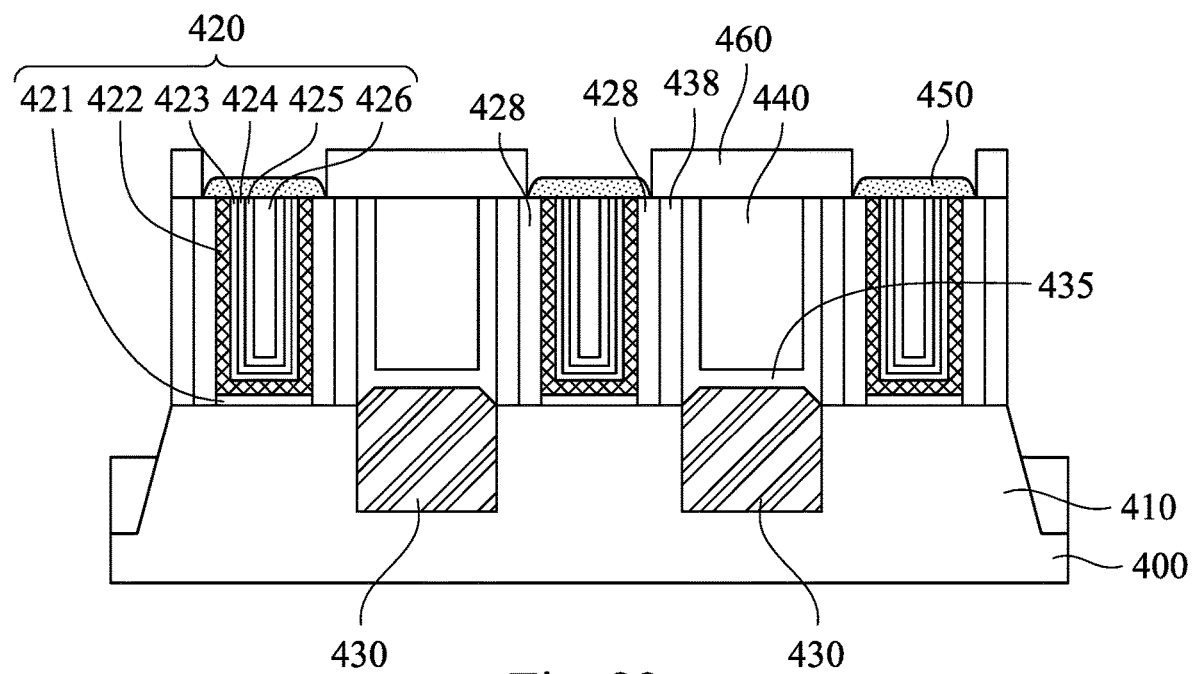

Reference is made to FIG. 22. An atomic layer deposition (ALD) process is employed to form a dielectric layer 460 over the interlayer dielectric 440, the gate spacers 428 and 438, and the CESL 435. Due to the material properties, precursors of the ALD process have a tendency not to adhere to the surface of the inhibitor 450. Thus, during the ALD process, the dielectric layer 460 may be formed over the interlayer dielectric 440, the gate spacers 428 and 438, and the CESL 435, but leaving the top surface of the inhibitor 450 uncovered.

Figure 23:
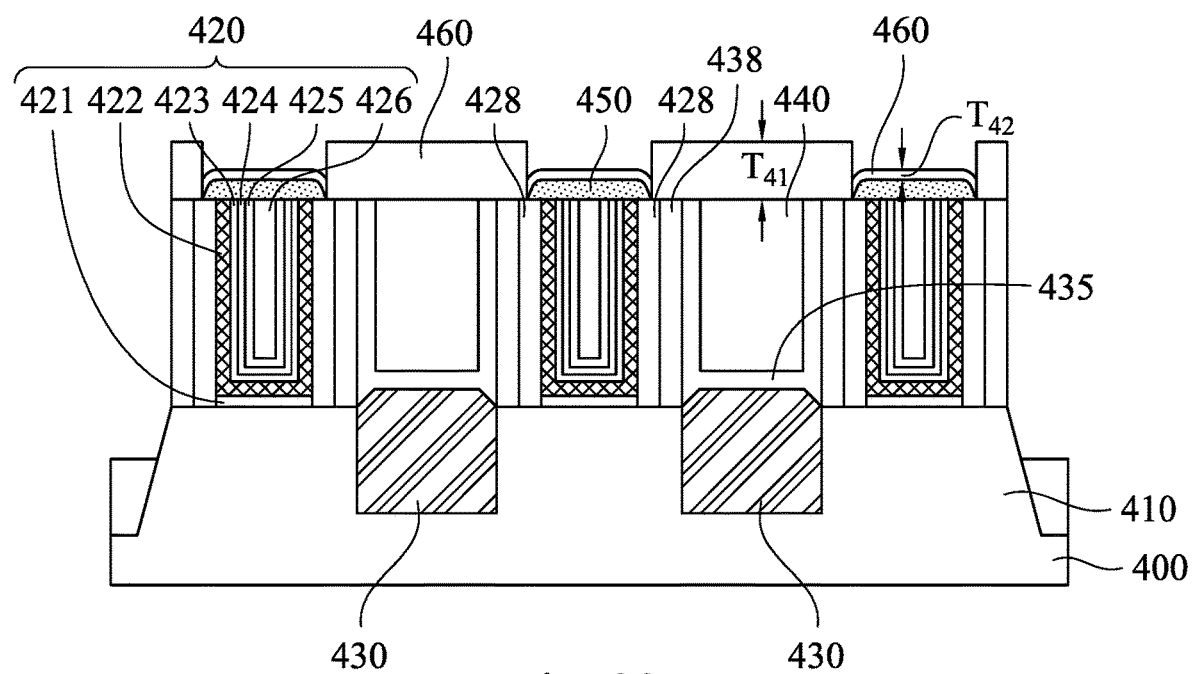

Reference is made to FIG. 23. However, after plural reaction cycles of the ALD process, the dielectric layer 460 may start to form on the inhibitor 450. As illustrated, a portion of the dielectric layer 460 over the interlayer dielectric 440, the gate spacers 428 and 438, and the CESL 435 has a thickness $T_{41}$, and another portion of the dielectric layer 460 over the inhibitor 450 has a thickness $T_{42}$, in that thickness $T_{41}$ is greater than thickness $T_{42}$. From other perspectives, due to material properties, the dielectric layer 460 has greater growing rate on the interlayer dielectric 440, the gate spacers 428 and 438, and the CESL than on the inhibitor 450. In some embodiments, the number of reaction cycles of the ALD process may be in a range from about 1 to about 100.

Figure 24:
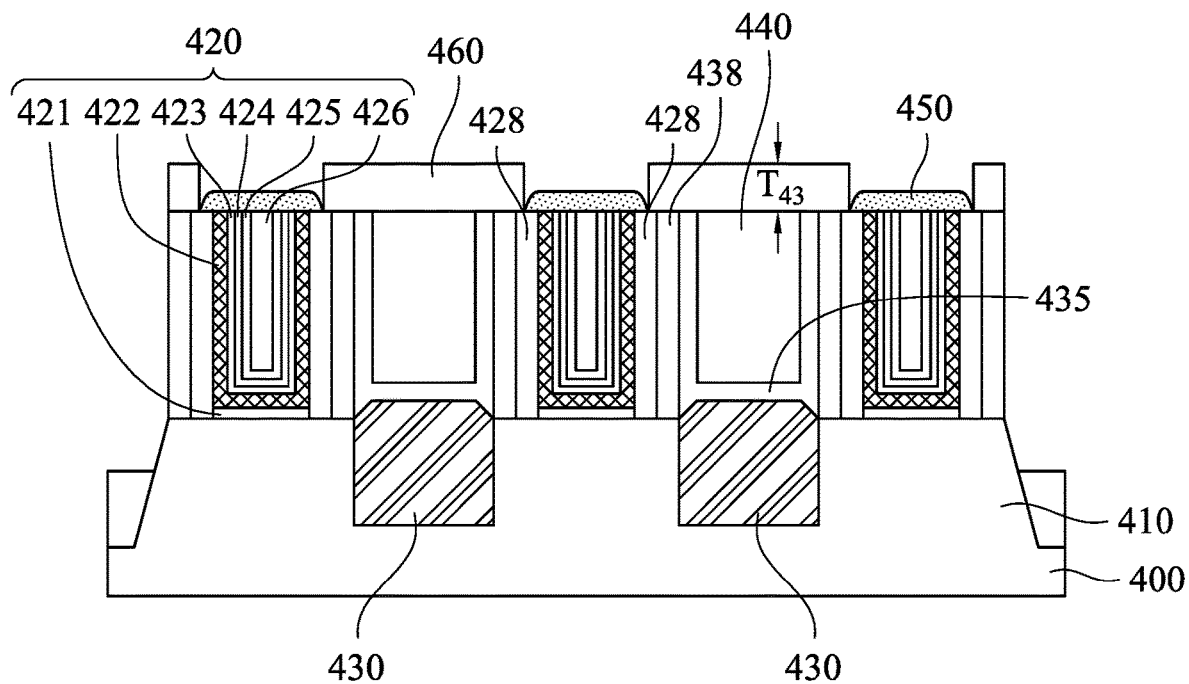

Reference is made to FIG. 24. An atomic layer etching (ALE) process is performed to remove the dielectric layer 460 over the inhibitor 450. That is, the unwanted dielectric layer 460 formed on the inhibitor 450 is removed during the ALE process, so as to expose the surface of the inhibitor 450 After the ALE process, the portion of the dielectric layer 460 over the interlayer dielectric 340 has a thickness $T_{43}$. During the ALE process, the portion of the dielectric layer 460 over the interlayer dielectric 440, the gate spacers 428 and 438, and the CESL 435 is partially removed. In some embodiments, the thickness of the removed portion of the dielectric layer 460 over the interlayer dielectric 440 is substantially equal to the removed thickness of the dielectric layer 460 over the inhibitor 450. In other words, the thicknesses $T_{41}$ (referring to FIG. 23), $T_{42}$ (referring to FIG. 23), and $T_{43}$ substantially satisfy: $T_{43}=T_{41}-T_{42}$. In some embodiments, the thickness $T_{43}$ is in a range from about 10 nm to about 100 nm. The ALE process may include plural reaction cycles to remove a desired thickness of the inhibitor 450. In some embodiments, the number of the reaction cycles of the ALE may be in a range from about 0 to about 50.

The ALD process and the ALE process discussed in FIGS. 22 to 24 may be regarded as a formation cycle for forming the dielectric layer 460 over the interlayer dielectric 440, the gate spacers 426, and CESL 435 having thickness $T_{43}$, and with the inhibitor 450 uncovered. The formation cycle may be expressed by the following equation:

$$X*(\text{ALD reaction cycle})+Y*(\text{ALE reaction cycle})=1*(\text{formation cycle})$$

In other words, a formation cycle includes performing X times of ALD cycle and Y times of ALE cycle. In some embodiments, the ratio of X to Y (X/Y) is in a range from about 1 to about 15. In some other embodiments, X is greater than Y, and thus the ratio of X to Y (X/Y) is greater than 1.

Figure 25:
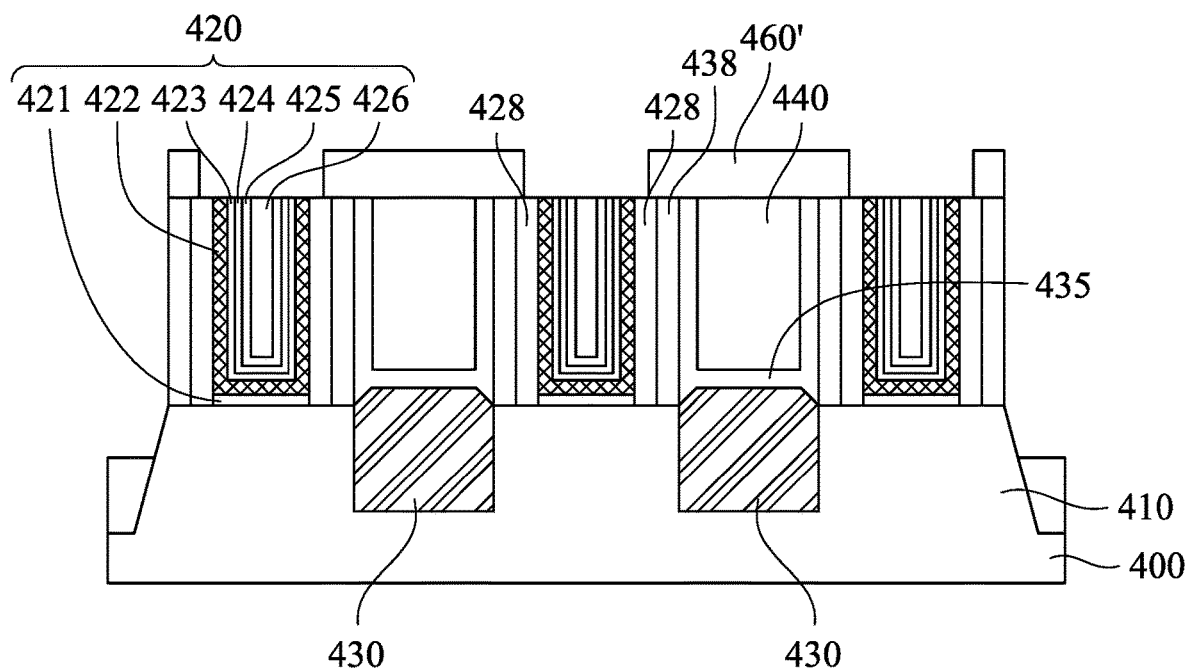

Reference is made to FIG. 25. The processes discussed in FIGS. 22 to 24 are repeated plural times (or performed in an alternating manner) to form the dielectric layer 460'. In other words, the formation cycle of the dielectric layer 460 of FIGS. 22 to 24 is repeated to form the dielectric layer 460'. In FIG. 25, the dielectric layer 460' can be referred to as a hard mask layer. In some embodiments, the number Z of the formation cycle may be in a range from about 100 to about 1000. In some other embodiments, the number Z of the formation cycle may be in a range from about 100 to about 500. The formation principle of the dielectric layer 460' is similar to that described in FIG. 7, and will not be repeated for simplicity.

Then, the inhibitor 450 (referring to FIG. 24) is removed to expose the top surface of the gate stacks 420. The removal of the inhibitor 450 is the same or similar to that of the inhibitor 150 of FIG. 6, and will not be repeated for simplicity. In some embodiments, an etching back process (not shown) may be performed to remove a portion of the gate stacks 420. During the etching back process, the hard mask layer 460' may be used as a mask to protect the material below (i.e., the ILD 440) from being etched.

FIGS. 26 to 31 illustrate a method of manufacturing a semiconductor structure at various stages in accordance with some embodiments.

Figure 26:
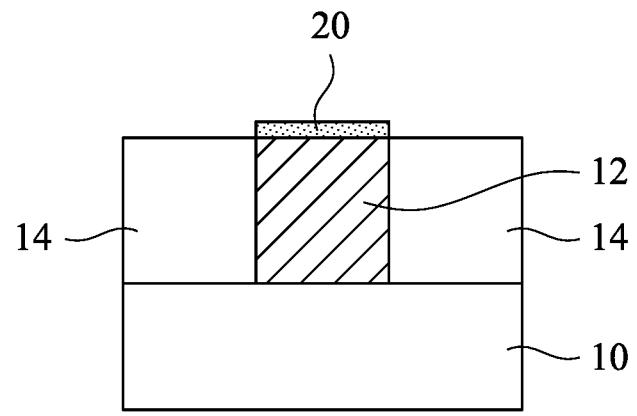
FIGS. 26 to 31 illustrate a method of manufacturing a semiconductor structure at various stages in accordance with some embodiments.

Reference is made to FIG. 26. An underlying structure 10 is provided. In some embodiments, the underlying structure 10 may be a substrate, such as a silicon substrate. In some other embodiments, the underlying structure 10 may be conductive structures, transistors, resistors, capacitors, local wirings, isolation layers and/or device isolation layers.

A first material 12 is formed over the underlying structure 10. Further, at least one second material 14 is formed over the underlying structure 10 and adjacent to the first material 12. The numbers of the first and second materials 12 and 14 are merely used to explain, and the present disclosure is not limited thereto.

In some embodiments, the first material 12 and the second materials 14 may be metal, metal oxide, or dielectric. However, the first material 12 and the second materials 14 are made from different type of materials. For example, once the first material 12 is made from metal, the second materials are made from metal oxide or dielectric. Or, once the first material 12 is made from metal oxide, the second materials are made from metal or dielectric. Alternately, once the first material 12 is made from dielectric, the second materials are made from metal or metal oxide. In some embodiments, the thicknesses of the first material 12 and the second materials 14 may be in a range from about 1 nm to about 500 nm.

In some embodiments, possible metals can be W, TiN, Co, Ru, or Pt, but the present disclosure is not limited thereto. In some embodiments, possible metal oxides can be SiO, SiN, SiC, SiOC, SiON, SiCN, or SiOCN, but the present disclosure is not limited thereto. In some embodiments, possible dielectrics can be $ZrO_2$, $Al_2O_3$, $Y_2O_3$, AlON, $Yb_2O_3$, $ZrAlO_x$, $La_2O_3$, or $TiO_2$, but the present disclosure is not limited thereto.

Then, an inhibitor 20 is selectively formed on the first material 12. In some embodiments, the inhibitor 20 has material property such that the inhibitor 20 may be formed on the first material 12, and not on the second material 14. That is, the inhibitor 20 is formed on the first material 12 in a self-aligned manner. In some embodiments, the thickness of the inhibitor 20 may be in a range from 0.1 nm to about 10 nm. The material of the inhibitor 20 may be similar to inhibitors 150, 250, 350, and 450 described in FIGS. 1-25, and will not be repeated for simplicity. The inhibitor 20 may include material that suppresses the deposition rate of the deposition process in following step.

Figure 27:
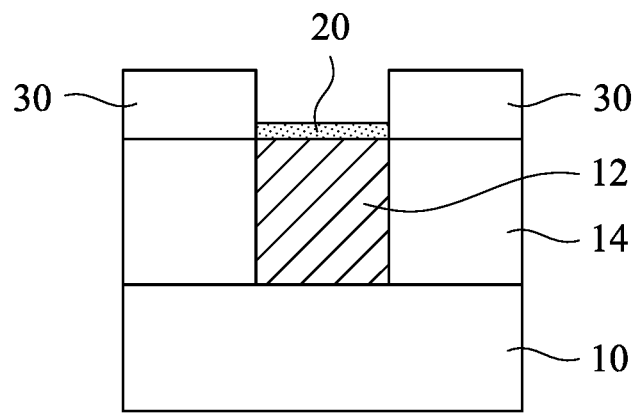

Reference is made to FIG. 27. An atomic layer deposition (ALD) process is employed to form a patterned deposition layer 30 self-aligned to the second materials 14. In FIG. 27, the patterned deposition layer 30 has a thickness which is determined by the deposition cycles of ALD processes. The precursor (and/or the reactant) in every cycle can be the same or different. In some embodiments, the patterned deposition layer 30 can be a conductive layer; in some other embodiments, the patterned deposition layer 30 can be a dielectric layer.

Moreover, ALD is surface sensitive deposition process, i.e., the film growth is dependent on the material's surface characteristics. For example, the terminal groups of the inhibitor 20 is substantially inert with the precursors of the ALD process, and the middle portions of the inhibitor 20 form a good coverage to block the precursors (forming steric hindrance) from reacting with the first material 12. As such, the precursors are prevented from bonding to the inhibitor 20, and the patterned deposition layer 30 can be selectively formed on the second materials 14.

In FIG. 27, due to the material properties as mentioned above, precursors of the ALD process have a tendency not to adhere to the surface of the inhibitor 20. In this way, the precursors of the ALD process have high selectivity between the inhibitor 20 and the second materials 14. Specifically, the ALD process has selectivity for the second materials 14 with respect to the inhibitor 20. Moreover, the ALD selectivity for the second materials 14 with respect to the inhibitor 20 is greater than an ALD selectivity for the second materials 14 with respect to the first material 12. As such, by forming the inhibitor 20, the deposition rate of the patterned deposition layer 30 over the first material 12 (on the inhibitor) can be efficiently suppressed. Thus, during the ALD process, the patterned deposition layer 30 may be formed over the second materials 14, but leaving the top surface of the inhibitor 20 uncovered. In other words, the patterned deposition layer 30 may not be formed on the inhibitor 20 that covers the first material 12. Such method may also be referred to as "inhibitor coating." The ALD process may include plural reaction cycles to form a desired thickness of the patterned deposition layer 30.

In some embodiments, precursors of the ALD process may include Cl-based and metal-organic materials. For example, Cl-based materials may include $AlCl_3$, $ZrCl_4$, or $HfCl_4$. Further, metal-organic materials may include Tris (dimethylamino) cyclopentadienyl Zirconium (ZyALD), Y(isopropylcyclopentadienyl)$_2$(iPr-amd)), Trimethyl(methylcyclopentadienyl)platinum ($CH_3CpPt(CH_3)_3$), Bis(methylcyclopentadienyl)methyl methoxy hafnium (HfD-04), Cyclopentadienylzirconium trichloride ($CpZrCl_3$). In some embodiments, the ALD process may be performed with pressure in a range of 0.5 torr to 100 torr, a flow rate of precursor in a range of 500 sccm to 10000 sccm, and temperature in a range of 100° C. to 700° C.

In some embodiments, the patterned deposition layer 30 may include SiO, SiN, SiC, SiOC, SiON, SiCN, SiOCN, $ZrO_2$, $Al_2O_3$, $Y_2O_3$, AlON, $HfO_2$, $HfZrO_x$, $HfSiO_x$, HfSiON, $ZrSiO_x$, $HfZrSiO_x$, $HfAlO_x$, HfAlN, $ZrAlO_x$, $La_2O_3$, $TiO_2$, $Yb_2O_3$.

Reference is made to FIG. 27. However, after plural reaction cycles of the ALD process, the patterned deposition layer 30 may start to form on the inhibitor 20. That is, the inhibitor coating method may fail after critical reaction cycles of the ALD process are performed. In some embodiments, the inhibitor coating method may fail when the thickness of the patterned deposition layer 30 reaches about 10 nm. As illustrated, a portion of the patterned deposition layer 30 over the second materials 14 has a thickness $T_1$, and another portion of the patterned deposition layer 30 over the inhibitor 20 has a thickness $T_2$, in that thickness $T_1$ is greater than thickness $T_2$. State another way, due to material properties, the patterned deposition layer 30 has greater growing rate on the second materials 14 than on the inhibitor 20. In some embodiments, the number of reaction cycles of the ALD process may be in a range from about 1 to about 100.

Figure 29:
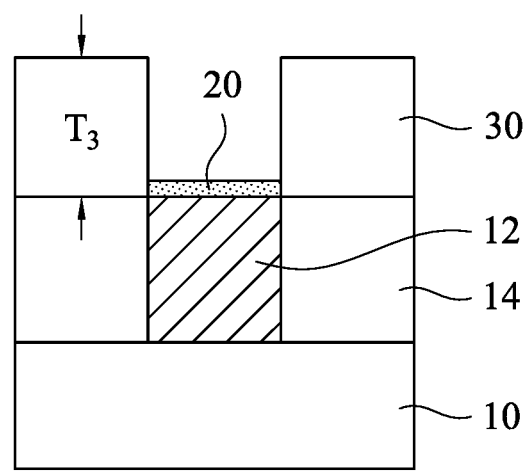
Figure 30:
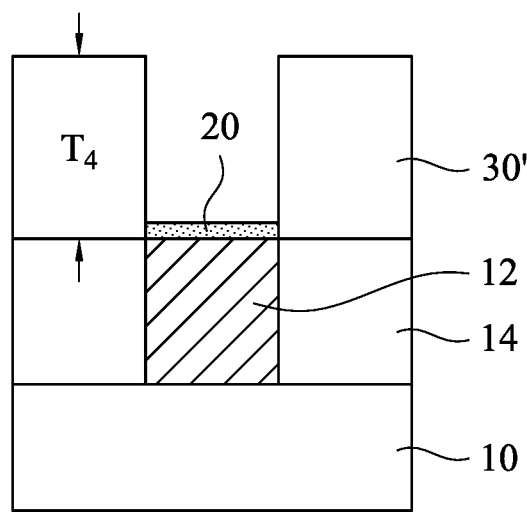

Reference is made to FIG. 29. An ALE process is performed to remove the patterned deposition layer 30 over the inhibitor 20. After the ALE process, the top surface of the inhibitor 20 is exposed by removing the patterned deposition layer 30 over the inhibitor 20. After the ALE process, the portion of the patterned deposition layer 30 over the second materials 14 has a thickness $T_3$. During the ALE process, the portion of the patterned deposition layer 30 over the second materials 14 is partially removed, accordingly. In some embodiments, the thickness of the removed portion of the patterned deposition layer 30 over the second materials 14 is substantially equal to the removed thickness of the patterned deposition layer 30 over the inhibitor 20. In other words, the thicknesses $T_1$ (referring to FIG. 1C), $T_2$ (referring to FIG. 1C), and $T_3$ substantially satisfy: $T_3=T_1-T_2$. In some embodiments, the thickness $T_3$ is in a range from about 10 nm to about 100 nm. The ALE process may include plural reaction cycles to remove a desired thickness of patterned deposition layer 30 over the inhibitor 20. In some embodiments, the number of the reaction cycles of the ALE is smaller than the number of the reaction cycles of ALD and may be in a range from about 1 to about 50.

In some embodiments, etchants of the ALE process may include $O_2$, Ar, $H_2$ plasma, or the like. In some other embodiments, etchants of the ALE process may include Cl-based gas or F-based gas. For example, the Cl-based gas may be $Cl_2$, $BCl_3$, or the like. The F-based gas may be $CF_4$, $C_4F_8$, $CH_3F$, $CH_2F_2$, $CHF_3$, $CF_x$, $NF_3$, or the like. In some other embodiments, etchants of the ALD process may include ion bombardment. For example, the ion of the ion bombardment may be Ar, He, or the like.

Figure 28:
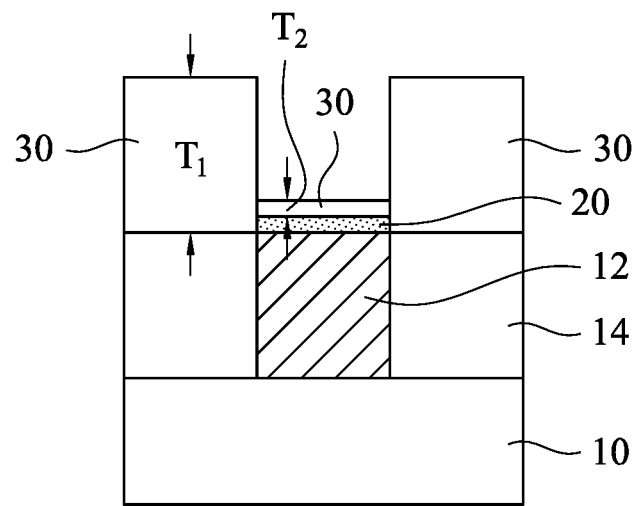

Referring again to FIGS. 27, 28, and 29. FIGS. 27 and 28 discuss performing plural reaction cycles of ALD process to form the patterned deposition layer 30 over the second materials 14 until the patterned deposition layer 30 starts to form on the inhibitor 20. FIG. 29 discusses plural reaction cycles of ALE process to remove the patterned deposition layer 30 on the inhibitor 20 until the top surface of the inhibitor 20 is exposed. As mentioned before, the number X of reaction cycles of the ALD process may be in a range from about 1 to about 100, and the number Y of reaction cycles of the ALE process may be in a range from about 1 to about 50. In some embodiments, the ratio of X to Y (X/Y) is in a range from about 1 to about 15. In some other embodiments, the number X of reaction cycles of the ALD process is greater than the number Y of reaction cycles of the ALE process. That is, X is greater than Y, and thus the ratio of X to Y (X/Y) is greater than 1.

The ALD process and the ALE process discussed in FIGS. 27 to 29 may be regarded as a formation cycle for forming the patterned deposition layer 30 over the second materials 14 having the thickness $T_3$, and with the inhibitor 20 uncovered. The formation cycle may be expressed by the following equation:

$$X*(\text{ALD reaction cycle}) + Y*(\text{ALE reaction cycle}) = 1*(\text{formation cycle})$$

In other words, a formation cycle includes performing X times of ALD reaction cycle and Y times of ALE reaction cycle.

Reference is made to FIG. 29. The processes discussed in FIGS. 27 to 29 are repeated plural times (or performed in an alternating manner) to form the patterned deposition layer 30' having a desired thickness $T_4$. In other words, the formation cycle of the patterned deposition layer 30 of FIGS. 27 to 29 is repeated to form the dielectric layer 30'. In some embodiments, the number Z of the formation cycle may be in a range from about 100 to about 1000. In some other embodiments, the number Z of the formation cycle may be in a range from about 100 to about 500. The values of X in different formation cycles can be different or the same, and/or the values of Y in different formation cycles can be different or the same. For example, X1 ALD reaction cycles, Y1 ALE reaction cycles, X2 ALD reaction cycles, and Y2 ALE reaction cycles are sequentially performed, where X1 and X2 are different or the same, and/or Y1 and Y2 are different or the same.

Figure 31:
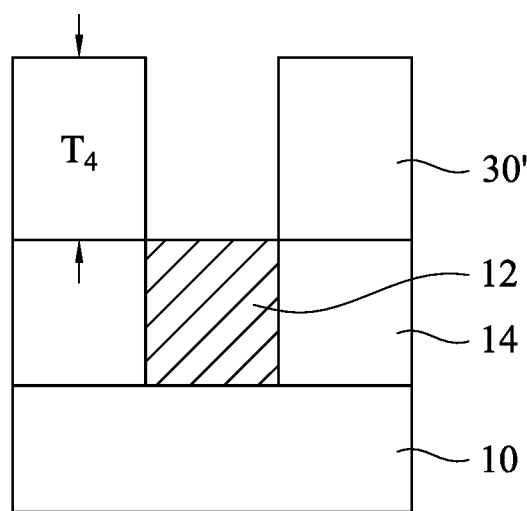

Reference is made to FIG. 31. After the patterned deposition layer 30' is formed, the inhibitor 20 (referring to FIG. 30) is removed to expose the top surface of the first material 12. The inhibitor 20 can be removed by performing a baking or etching process.

According to the aforementioned embodiments, a first material and a second material is form on an underlying structure. An inhibitor is selectively formed on the first material and leaving a top surface of the second material uncovered. A deposition process is performed to form a patterned deposition layer over the second material until the dielectric layer start to form on the inhibitor. An etching process is then performed to remove a portion of the dielectric layer over the inhibitor. The deposition process and the etching process are repeated to form a desired thickness of the dielectric layer. As such, the embodiments of present disclosure provide an effective way to form a patterned deposition layer selectively on a target material. The embodiments of present disclosure can also reduce voids and/or seams in the patterned deposition layer. A planarization process, such as CMP, can also be skipped to avoid material loss.

In some embodiments of the present disclosure, a semiconductor device includes a substrate, a gate structure over the substrate, gate spacers on opposite sidewalls of the gate structure, an inhibitor residue over gate structure and between the gate spacers, and source/drain structures on opposite sides of the gate structure. The inhibitor residue lines a sidewall of one of the gate spacers.

In some embodiments of the present disclosure, a semiconductor device includes a substrate, gate spacers on opposite sidewalls of the gate structure, a metal layer, a conductive layer over the metal layer, and source/drain structures on opposite sides of the gate structure. Top surfaces of the gate spacers are level with a top surface of the gate structure. The metal layer covers an entirety of the top surface of the gate structure but not covering the top surfaces of the gate spacers. A sidewall of the conductive layer is coterminous with a sidewall of the metal layer.

In some embodiments of the present disclosure, a semiconductor device includes a substrate, a gate structure over the substrate, a gate spacer on a sidewall of the gate structure, an interlayer dielectric (ILD) layer adjacent to the gate spacer, and a dielectric layer. A top surface of the gate spacer is level with a top surface of the gate structure. The dielectric layer extends from a top surface of the ILD layer to a first portion of the top surface of the gate spacer and terminating prior to reaching a second portion of the top surface of the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a gate structure over the substrate;
   gate spacers on opposite sidewalls of the gate structure, wherein each of the gate spacers has an inner sidewall in contact with the gate structure;
   an inhibitor residue over the gate structure and between the gate spacers, wherein the inhibitor residue lines the inner sidewall of one of the gate spacers; and
   source/drain structures on opposite sides of the gate structure.

2. The semiconductor device of claim 1, wherein the inhibitor residue is in contact with a top surface of the gate structure.

3. The semiconductor device of claim 1, further comprising a conductive layer over the gate structure and between the gate spacers, wherein the inhibitor residue lines a sidewall of the conductive layer.

4. The semiconductor device of claim 3, wherein the conductive layer is spaced apart from the gate spacers.

5. The semiconductor device of claim 3, wherein top surfaces of the gate spacers, a top surface of the inhibitor residue, and a top surface of the conductive layer are coplanar.

6. The semiconductor device of claim 1, wherein the gate structure comprises a gate dielectric layer, a work function metal layer over the gate dielectric layer, and a gate electrode over the work function metal layer, and the inhibitor residue is in contact with the gate dielectric layer.

7. The semiconductor device of claim 6, wherein the inhibitor residue is spaced apart from the gate electrode of the gate structure.

8. The semiconductor device of claim 1, wherein the inhibitor residue is made of a self-assemble monolayer (SAM).

9. The semiconductor device of claim 1, wherein the inhibitor residue is made of a polymer.

10. A semiconductor device, comprising:
    a substrate;
    a gate structure over the substrate;

gate spacers on opposite sidewalls of the gate structure, wherein top surfaces of the gate spacers are level with a top surface of the gate structure;

a metal layer covering an entirety of the top surface of the gate structure but not covering the top surfaces of the gate spacers;

a conductive layer over the metal layer, wherein a sidewall of the conductive layer is coterminous with a sidewall of the metal layer; and source/drain structures on opposite sides of the gate structure.

11. The semiconductor device of claim 10, wherein the gate structure comprises a gate dielectric layer, a capping layer over the gate dielectric layer, a first work function metal layer over the capping layer, a second work function metal layer over the first work function metal layer, and a gate electrode over the second work function metal layer; and wherein the metal layer is in contact with the gate dielectric layer, the capping layer, the first work function metal layer, the second work function metal layer, and the gate electrode.

12. The semiconductor device of claim 10, where a bottom surface of the conductive layer and a top surface of the metal layer have substantially the same width.

13. The semiconductor device of claim 10, wherein the conductive layer is thicker than the metal layer.

14. The semiconductor device of claim 10, wherein the metal layer does not vertically overlap the gate spacers.

15. A semiconductor device, comprising:
a substrate;
a gate structure over the substrate;
a gate spacer on a sidewall of the gate structure, wherein a top surface of the gate spacer is level with a top surface of the gate structure;
an interlayer dielectric (ILD) layer adjacent to the gate spacer; and
a dielectric layer extending from a top surface of the ILD layer to a first portion of the top surface of the gate spacer and terminating prior to reaching a second portion of the top surface of the gate spacer.

16. The semiconductor device of claim 15, further comprising a source/drain structure in the substrate and under the ILD layer, wherein the dielectric layer is wider than the source/drain structure.

17. The semiconductor device of claim 16, wherein the dielectric layer overlaps an entirety of the source/drain structure.

18. The semiconductor device of claim 15, further comprising a contact etch stop layer (CESL) between the ILD layer and the gate spacer, and the dielectric layer is in contact with a top surface of the CESL.

19. The semiconductor device of claim 15, wherein the gate spacer comprises a first spacer layer in contact with the gate structure and a second spacer layer spaced from the gate structure by the first spacer layer, wherein the dielectric layer covers an entirety of a top surface of the second spacer layer and a partial region of a top surface of the first spacer layer.

20. The semiconductor device of claim 15, wherein the gate structure is free from coverage of the dielectric layer.

* * * * *